US006768490B2

(12) United States Patent
Champion et al.

(10) Patent No.: US 6,768,490 B2
(45) Date of Patent: Jul. 27, 2004

(54) CHECKERBOARD BUFFER USING MORE THAN TWO MEMORY DEVICES

(75) Inventors: Mark Champion, Kenmore, WA (US); Brian Dockter, Edmonds, WA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 200 days.

(21) Appl. No.: 10/077,636

(22) Filed: Feb. 15, 2002

(65) Prior Publication Data

US 2002/0149596 A1 Oct. 17, 2002

Related U.S. Application Data

(60) Provisional application No. 60/269,784, filed on Feb. 15, 2001, provisional application No. 60/269,783, filed on Feb. 15, 2001, and provisional application No. 60/324,498, filed on Feb. 24, 2001.

(51) Int. Cl.[7] .................................................. G09G 5/36

(52) U.S. Cl. ........................ 345/545; 345/539; 345/546; 711/157; 711/168

(58) Field of Search ................................. 345/531, 539, 345/540, 545, 546; 711/127, 157, 168

(56) References Cited

U.S. PATENT DOCUMENTS

| | | | | |
|---|---|---|---|---|
| 4,449,199 A | | 5/1984 | Daigle | |
| 5,142,276 A | | 8/1992 | Moffat | |
| 5,195,182 A | | 3/1993 | Sasson | |
| 5,303,341 A | | 4/1994 | Rivshin | |
| 5,479,605 A | * | 12/1995 | Saitoh | 345/561 |
| 5,559,953 A | | 9/1996 | Seiler et al. | |
| 5,561,777 A | | 10/1996 | Kao et al. | |
| 5,579,473 A | | 11/1996 | Schlapp et al. | |
| 5,606,650 A | | 2/1997 | Kelley et al. | |
| 5,619,471 A | | 4/1997 | Nunziata | |
| 5,633,726 A | | 5/1997 | Timmermans | |

(List continued on next page.)

OTHER PUBLICATIONS

U.S. patent application Ser. No. 09/907,852, Champion et al., filed Jul. 17, 2001.

U.S. patent application Ser. No. 09/907,854, Champion et al., filed Jul. 17, 2001.

U.S. patent application Ser. No. 09/908,295, Champion et al., filed Jul. 17, 2001.

U.S. patent application Ser. No. 09/908,301, Champion et al., filed Jul. 17, 2001.

(List continued on next page.)

*Primary Examiner*—Matthew C. Bella
*Assistant Examiner*—Mackly Monestime
(74) *Attorney, Agent, or Firm*—Thomas F. Lebens; Fitch, Even, Tabin & Flannery

(57) ABSTRACT

Methods and apparatus for storing and retrieving data in parallel but in different orders, using three or more memory devices. In one implementation, data for pixels is stored according to a checkered pattern, sequentially among memory devices, forming a checkerboard buffer. In one implementation, a checkerboard buffer includes: a data source, providing data in a first order; a data destination, receiving data in a second order; at least three memory devices each having memory locations, where data is stored in parallel to and retrieved in parallel from the memory devices; a first data switch connected to the data source and each of the memory devices, the first data switch controls which data is stored to which memory device; and a second data switch connected to the data destination and each of the memory devices, the second data switch controls providing data to the data destination according to the second order.

26 Claims, 22 Drawing Sheets

U.S. PATENT DOCUMENTS

| | | | | | |
|---|---|---|---|---|---|
| 5,781,201 | A | | 7/1998 | McCormack et al. | |
| 5,794,016 | A | | 8/1998 | Kelleher | |
| 5,798,843 | A | * | 8/1998 | Yamamoto et al. | 358/404 |
| 5,815,167 | A | | 9/1998 | Muthal et al. | |
| 5,815,169 | A | | 9/1998 | Oda | |
| 5,924,111 | A | | 7/1999 | Huang et al. | |
| 5,933,154 | A | | 8/1999 | Howard et al. | |
| 6,005,592 | A | | 12/1999 | Koizumi et al. | |
| 6,031,638 | A | | 2/2000 | Rao et al. | |
| 6,111,992 | A | * | 8/2000 | Likhterov et al. | 382/260 |
| 6,177,922 | B1 | * | 1/2001 | Schiefer et al. | 345/698 |
| 6,226,709 | B1 | | 5/2001 | Goodwin et al. | |
| 6,259,459 | B1 | | 7/2001 | Middleton | |
| 6,278,645 | B1 | | 8/2001 | Buckelew et al. | |
| 6,301,649 | B1 | | 10/2001 | Takasugi | |
| 6,331,854 | B1 | | 12/2001 | Rogers et al. | |
| 6,347,344 | B1 | * | 2/2002 | Baker et al. | 710/20 |
| 6,417,867 | B1 | | 7/2002 | Hallberg | |
| 6,496,192 | B1 | * | 12/2002 | Shreesha et al. | 345/540 |
| 6,549,207 | B1 | | 4/2003 | Matsumoto | |
| 6,567,531 | B1 | | 5/2003 | Kondo et al. | |
| 6,587,112 | B1 | * | 7/2003 | Goeltzenleuchter et al. | 345/532 |
| 2002/0109691 | A1 | | 8/2002 | Champion | |
| 2002/0109692 | A1 | | 8/2002 | Champion | |
| 2002/0109693 | A1 | | 8/2002 | Champion | |
| 2002/0109694 | A1 | | 8/2002 | Champion | |
| 2002/0109695 | A1 | | 8/2002 | Champion | |
| 2002/0109696 | A1 | | 8/2002 | Champion | |
| 2002/0109699 | A1 | | 8/2002 | Champion | |
| 2002/0109791 | A1 | | 8/2002 | Champion | |
| 2002/0109792 | A1 | | 8/2002 | Champion | |
| 2002/0110030 | A1 | | 8/2002 | Champion | |
| 2002/0113904 | A1 | | 8/2002 | Champion | |
| 2002/0130876 | A1 | | 9/2002 | Champion | |
| 2003/0058368 | A1 | | 3/2003 | Champion | |
| 2003/0151609 | A1 | | 8/2003 | Champion | |

OTHER PUBLICATIONS

*SMPTE Standard for Television 1920×1080 Scanning and Analog and Parallel Digital Interfaces for Multiple Picture Rates*; SMPTE 274–1998; Copyright 1998; pp. 1–24; Revision of ANSI/SMPTE 274M–1995; The Society of Motion Picture and Television Engineers; White Plains, New York.

Bloom, D.M.; *The Grating Light Valve: revolutionizing display technology*; pp. 1–10; Silicon Light Machines (formerly Echelle, Inc.).

Corrigan, R.W., et al.; *An Alternative Architecture for High Performance Display; Presented at the 141st* SMPTE Technical Conference and Exhibition; Nov. 20, 1999, New York, New York; pp. 1–5; Silicon Machines, Sunnyvale, CA.

Hearn, D., et al.; *Computer Graphics C Version* [2d Ed.]; pp. 53–56; Prentice Hall, Upper Saddle River, New Jersey.

McCarron, D., et al.; Accelerating PC Graphics, Emerging Technologies Edition, Market Strategy and Forecast Report; 1995; pp. 2–49 through 2–93, 2–159 (labeled as pp. 1–46); Mercury Research.

Lieberman, David; *Sony champions MEMS display technology*; EE Times, Jul. 14, 2000; http://www.eetimes.com/story/OEG20000714S0004.

* cited by examiner

| 0 | 1 | 2 | 3 | 4 | 5 | 6 | 7 |
|---|---|---|---|---|---|---|---|
| 8 | 9 | 10 | 11 | 12 | 13 | 14 | 15 |
| 16 | 17 | 18 | 19 | 20 | 21 | 22 | 23 |
| 24 | 25 | 26 | 27 | 28 | 29 | 30 | 31 |

| 0 | 2 | 4 | 6 |
|---|---|---|---|
| 8 | 10 | 12 | 14 |
| 16 | 18 | 20 | 22 |
| 24 | 26 | 28 | 30 |

| 1 | 3 | 5 | 7 |
|---|---|---|---|
| 9 | 11 | 13 | 15 |
| 17 | 19 | 21 | 23 |
| 25 | 27 | 29 | 31 |

| STATE | FIRST MEMORY | SECOND MEMORY | THIRD MEMORY | FOURTH MEMORY |
|---|---|---|---|---|
| A | 1 | 2 | 3 | 4 |
| B | 2 | 3 | 4 | 1 |
| C | 3 | 4 | 1 | 2 |
| D | 4 | 1 | 2 | 3 |

| STATE | FIRST DESTINATION BUS | SECOND DESTINATION BUS | THIRD DESTINATION BUS | FOURTH DESTINATION BUS |
|---|---|---|---|---|
| A | 1 | 2 | 3 | 4 |
| B | 2 | 3 | 4 | 1 |
| C | 3 | 4 | 1 | 2 |
| D | 4 | 1 | 2 | 3 |

| ADDRESS | FIRST MEMORY | SECOND MEMORY | THIRD MEMORY | FOURTH MEMORY |
|---|---|---|---|---|
| 0 | 0 | 1 | 2 | 3 |
| 1 | 4 | 5 | 6 | 7 |
| ... | ... | ... | ... | ... |
| 479 | 1916 | 1917 | 1918 | 1919 |
| 480 | UNUSED | UNUSED | UNUSED | UNUSED |
| ... | ... | ... | ... | ... |
| 511 | UNUSED | UNUSED | UNUSED | UNUSED |
| 512 | 1923 | 1920 | 1921 | 1922 |
| 513 | 1927 | 1924 | 1925 | 1926 |
| ... | ... | ... | ... | ... |
| 1024 | 3842 | 3843 | 3840 | 3841 |
| 1025 | 3846 | 3847 | 3844 | 3845 |
| ... | ... | ... | ... | ... |
| 1536 | 5761 | 5762 | 5763 | 5760 |
| 1537 | 5765 | 5766 | 5767 | 5764 |
| ... | ... | ... | ... | ... |

1750

| STATE | FIRST MEMORY (X;Y) | SECOND MEMORY (X;Y) | THIRD MEMORY (X;Y) | FOURTH MEMORY (X;Y) |
|---|---|---|---|---|
| A | 00 | 01 | 10 | 11 |
| B | 11 | 00 | 01 | 10 |
| C | 10 | 11 | 00 | 01 |
| D | 01 | 10 | 11 | 00 |

CHECKERBOARD BUFFER USING MORE THAN TWO MEMORY DEVICES

RELATED APPLICATIONS

This application claims the benefit of U.S. Provisional Application No. 60/269,784 filed Feb. 15, 2001, of U.S. Provisional Application No. 60/269,783 filed Feb. 15, 2001, and of U.S. Provisional Application No. 60/324,498 filed Sep. 24, 2001, the disclosures of which are incorporated herein by reference.

This application is related to the following co-pending and commonly assigned patent applications: U.S. application Ser. No. 09/908,295, filed Jul. 17, 2001 (Docket No. 70673); U.S. application Ser. No. 09/907,852, filed Jul. 17, 2001 (Docket No. 70674); U.S. application Ser. No. 09/907,854, filed Jul. 17, 2001 (Docket No. 70675); U.S. application Ser. No. 09/908,301, filed Jul. 17, 2001 (Docket No. 70676), the disclosures of which are incorporated herein by reference.

BACKGROUND

The present invention is related to video data storage. More particularly, the present invention is related to video display systems and frame buffers. Several related technologies are discussed below (in labeled sections for clarity).

1. Raster-Scan Displays

A common type of graphics monitor is a conventional raster-scan display using a cathode ray tube ("CRT"). As is well known, in a typical CRT, an electron beam strikes phosphor on the inner surface of the screen producing light visible on the outer surface of the screen. By controlling the electron beam different locations of the screen can be struck, creating a pattern and hence a video image. In a typical CRT raster-scan display, the screen area is divided into a grid of pixels (or picture elements). The electron beam sweeps from left to right across the screen, one row at a time from top to bottom, progressively drawing each pixel on the screen. Each row of pixels is commonly referred to as a scan line. In this type of conventional display, the scan lines are horizontal. The number of pixels in a single scan line is referred to as the width. One complete pass over the screen and the pixels in that pass are commonly referred to as a frame. As the electron beam moves across the pixels of each scan line, the beam intensity can be adjusted to vary the light produced by the screen phosphor corresponding to the pixels. The light emitted by the phosphor of the pixels creates a pattern of illuminated spots forming the video image. The intensity of the electron beam is controlled by image data stored in a section of memory called the frame buffer or refresh buffer.

2. Grating Light Valves

Another type of display system uses one or more grating light valves ("GLV") to produce an image. GLV's are known devices, and a description can be found in (among other sources) a paper by D. M. Bloom of Silicon Light Machines, Inc., titled "The Grating Light Valve: revolutionizing display technology" (1997; available from Silicon Light Machines; and a copy of which has been filed in an Information Disclosure Statement for this application), and in an article (and therein cited references) by R. W. Corrigan and others of Silicon Light Machines, Inc., titled "An Alternative Architecture for High Performance Display" (presented at the 141$^{st}$ SMPTE Technical Conference and Exhibition, Nov. 20, 1999, in New York, N.Y.), the disclosures of which are incorporated herein by reference. In overview, a GLV uses a combination of reflection and diffraction of light to create an image. A GLV includes a one-dimensional array of GLV pixels, each GLV pixel including a number of microscopic "ribbons." The ribbons for each GLV pixel can be deflected through electrostatic force to create an adjustable diffraction grating. In a non-deflected state, the ribbons reflect light. As the ribbons are deflected, the ribbons increasingly diffract light. Accordingly, by controlling the ribbons, the proportion of light that is either reflected or diffracted can be controlled for each GLV pixel. The GLV deflects the ribbons for each GLV pixel according to image data, such as pixel data received from a frame buffer.

An array of GLV pixels can create a column of visible pixels, such as 1088 pixels, typically an entire column at a time. A GLV can be used to create a vertical column of pixels in a high definition resolution image, such as a screen resolution of 1920 pixels horizontally by 1080 pixels vertically (with some of the 1088 pixels left blank or dark). By providing a GLV with pixel data representing columns of pixels in a frame, the GLV can create the frame of pixels, one column at a time, sweeping from left to right. The location of each column of pixels can be controlled external to the GLV array, such as through lenses and an adjustable mirror, rather than moving the GLV itself. A combination of three GLV's for red, green, and blue can be used to produce a color image.

3. Frame Buffers

FIG. 1A is a representation of a screen 105 as a grid of pixels 110. In FIG. 1A, for simplicity, screen 105 is only 4×4 and so only 16 pixels are shown, but a typical screen has many more pixels. One common screen resolution is high definition ("HD") resolution, where screen resolution indicates the number of pixels in a frame and is typically given as the horizontal resolution (number of pixels in one row) versus the vertical resolution (number of pixels in one column). HD resolution is either 1920×1080 (2,073,600 total pixels per frame) or 1280×720 (921,600 pixels per frame). Herein, HD resolution refers to 1920×1080.

Returning to FIG. 1A, the pixels 110 are often numbered sequentially for reference. Pixel 0 is typically at the upper left. FIG. 1B is a representation of a memory device 150 implementing a frame buffer as a grid of memory locations 155. Typical memory devices include SDRAM (synchronous dynamic random access memory). The actual memory device used may vary in different devices, but the memory locations for the frame buffer are typically in a contiguous block of locations with sequential addresses. Memory device 150 has a memory location 155 for storing pixel data (e.g., an intensity value) for each pixel 110 of screen 105. In some implementations, pixel data for more than one pixel is stored at each memory location. In many conventional raster-scan systems, pixel data is stored in memory locations adjacent to one another in the same pattern as the pixels on the screen. In FIG. 1B, each memory location 155 is numbered with the number of the pixel (110 from FIG. 1A) corresponding to the pixel data stored in that memory location 155. For example, the pixel at the upper left of the screen is pixel 0 in FIG. 1A and pixel data for pixel 0 is stored in the first memory location in memory device 150, as indicated by the "0" in the upper left memory location 155. The second memory location stores pixel data for pixel 1, the fifth memory location stores pixel data for pixel 4, and so on.

4. Pixel Rates

FIG. 2 is a representation of screen resolutions and typical data throughput requirements. FIG. 2 shows four resolutions in respective areas: VGA resolution (640×480) 205, XGA resolution (1024×768) 210, SXGA resolution (1280×1024)

215, and HD resolution (1920×1080) 220. The pixel rate for a screen resolution is the number of pixels per second that need to be processed to maintain the screen resolution at a specified refresh rate (i.e., the number of times a complete frame is drawn to the screen per second). While pixel rates vary among implementations, the pixel rates shown in FIG. 2 are representative. These pixel rates are given in megapixels per second ("MP/S"). For example, according to SMPTE 274M-1998 (a specification defining, among other things, pixel rates for resolutions of 1920×1080), for HD resolution 220 the pixel rate is about 150 MP/S @ 60 Hz. FIG. 2 also shows a corresponding approximate data rate in megabytes per second ("MB/S") for each resolution. The data rate is the number of bytes per second to be processed based on the number of bytes per pixel and the pixel rate. For example, HD resolution 220 has a data rate of 450 MB/S, at 24 bits per pixel (3 bytes). If each pixel has 32 bits of data, the data rate for HD resolution is 600 MB/S. However, the data rate of a typical 32-bit wide SDRAM running at 125 MHz is approximately 500 MB/S. A frame buffer architecture using two 125 MHz SDRAM's can realize a data rate of approximately 1000 MB/S.

5. Frame Buffers Using Parallel Storage in Two Memory Devices

FIG. 3A is a representation of a frame 305 of pixels 310 divided between two memory devices. Frame 305 has only 32 pixels for simplicity, but, as noted above, a typical HD resolution frame has 2,073,600 pixels. FIG. 3B is a representation of a first memory device 350 and FIG. 3C is a representation of a second memory device 375. Each pixel 310 in frame 305 is numbered, starting with pixel 0 in the upper left of frame 305. Even-numbered pixels are stored in first memory device 350 and odd-numbered pixels are stored in second memory device 375. The pixels stored in second memory device 375 are also shaded for clarity in FIGS. 3A and 3C.

FIG. 4 is a block diagram of a typical frame buffer architecture 400 capable of accessing pixel data for two pixels in parallel, supporting the representations shown in FIGS. 3A, 3B, and 3C. A video source 405 provides pixel data to a first memory 410 (recall first memory device 350 in FIG. 3B) and to a second memory 415 (recall second memory device 375 in FIG. 3C) in parallel and a video destination 420 retrieves pixel data from first memory 410 and from second memory 415 in parallel. In this implementation, pixel data for each pixel is stored in a separate addressable memory location. Video source 405 receives video data from another source (not shown), such as a broadcast source or a software application running on a computer system connected to video source 405. Video destination 420 controls the display of each pixel on a video device (not shown), such as a CRT. First memory 410 and second memory 415 are separate memory devices such as two SDRAM's. A first data bus 425 is connected to video source 405, first memory 410, and video destination 420. A second data bus 430 is connected to video source 405, second memory 415, and video destination 420. A source address bus 435 is connected to video source 405 and a first input 440 of an address multiplexor 445. A destination address bus 450 is connected to video destination 420 and a second input 455 of address multiplexor 445. An output 460 of address multiplexor 445 is connected to first memory 410 and second memory 415. Accordingly, the same address is provided to both first memory 410 and second memory 415. Address multiplexor 445 receives a control signal (not shown) to cause first input 440 or second input 455 to connect to output 460. First memory 410 and second memory 415 also receive control signals (not shown) to control whether memories 410 and 415 will read in data (write mode) or read out data (read mode). In addition, while clock lines are not shown in FIG. 4, architecture 400 operates based on clock cycles so that pixel data can be processed for two pixels per clock cycle in support of the desired pixel rate.

In operation, memories 410 and 415 read in or store complementary halves of a frame of pixels as pixel data from video source 405 and output the pixel data to video destination 420. To store pixel data, memories 410 and 415 are put in write mode and address multiplexor 445 is set to connect first input 440 to output 460. Video source 405 provides pixel data for a first pixel to first data bus 425, such as pixel 0 in FIG. 3A, and pixel data for a second pixel to second data bus 430, such as pixel 1 in FIG. 3A. First data bus 425 provides its pixel data to first memory 410 and second data bus 430 provides its pixel data to second memory 415. Video source 405 also provides an address to source address bus 435. To calculate the address, video source 405 can use a counter. Because each memory 410 and 415 stores pixel data for half the pixels in one frame, the counter typically ranges from 0 to one less than one-half of the number of pixels in one frame. Video source 405 can increment the counter by 1 for each pixel pair. Source address bus 435 provides the address to first input 440 of address multiplexor 445. Address multiplexor 445 in turn provides the address to first memory 410 and second memory 415. First memory 410 stores the pixel data on first data bus 425 at the address supplied by address multiplexor 445 from video source 405. Second memory 415 stores the pixel data on second data bus 430 at the same address. Two pixels have been stored in parallel in two memories using the same address. Referring to FIGS. 3A, 3B, and 3C, pixel 0 and pixel 1 are stored at the same time at the same address in first memory device 350 and second memory device 375, respectively. Accordingly, for example, pixel 0 is at address 0 in first memory device 350, pixel 1 is at address 0 in second memory device 375, pixel 2 is at address 1 in first memory device 350, pixel 3 is at address 1 in second memory device 375, and so on.

To retrieve pixel data, memories 410 and 415 are put in read mode and address multiplexor 445 is set to connect second input 455 to output 460. Video destination 420 provides an address to destination address bus 450. Destination address bus 450 provides the address to second input 455 of address multiplexor 445. Address multiplexor 445 in turn provides the address to first memory 410 and second memory 415. First memory 410 provides the pixel data stored at the address supplied by address multiplexor 445 from video destination 415 to first data bus 425. Second memory 415 provides the pixel data stored at the same address to second data bus 430. First data bus 425 provides its pixel data to video destination 420 and second data bus 430 provides its pixel data to video destination 420. Two pixels have been retrieved in parallel from two memories using the same address. Referring to FIGS. 3A, 3B, and 3C, pixel 0 and pixel 1 can be retrieved at the same time using the same address from first memory device 350 and second memory device 375, respectively.

FIG. 5 is a block diagram of another implementation of a dual pixel frame buffer architecture 500. Architecture 500 is similar to architecture 400 of FIG. 4, but a memory controller 545 provides data and addresses to memories 510 and 515. Memory controller 545 receives pixel data from video source 505 to store in memories 510 and 515. Memory controller 545 retrieves pixel data from memories 510 and

515 and provides the pixel data to video destination 520. Memory controller 545 replaces address multiplexor 445. Memory controller 545 receives signals from video source 505 and video destination 520 indicating whether pixel data is to be stored to or retrieved from memories 510 and 515. Memory controller 545 generates addresses and supplies these addresses along with control signals to memories 510 and 515. Accordingly, memory controller 545 controls address generation rather than video source 505 and video destination 520, as compared with architecture 400 of FIG. 4. In addition, as noted above with respect to FIG. 4, architecture 500 operates based on clock cycles so that pixel data can be processed for two pixels per clock cycle in support of the desired pixel rate.

6. Double-Buffering

Typical frame buffer architectures often also utilize "double-buffering." Double-buffering is a well known technique where the memory address space of a frame buffer is divided into two sections. In some architectures, each section is a separate memory device, and in other architectures one or more devices are each divided into sections. Data from a frame is stored in one section while data from a previously stored frame is read from the other section. Series of reading and writing operations alternate. For example, after storing pixel data for 16 pixels, pixel data for 16 pixels is retrieved. After storing a frame, the sections switch roles. Pixel data for blocks of pixels can be temporarily stored before being sent to memory or after being received from memory in a buffer, such as a FIFO buffer. In architectures 400 and 500 from FIGS. 4 and 5, respectively, FIFO buffers can be included in both the video source and the video destination, or in the memory controller.

SUMMARY

The present invention provides methods and apparatus for storing and retrieving data in parallel but in different orders, using three or more memory devices. In one implementation, data for pixels is stored according to a checkered pattern, sequentially among the memory devices, forming a checkerboard buffer. In one implementation, a checkerboard buffer includes: a data source, providing data in a first order; a data destination, receiving data in a second order; at least three memory devices, each memory device having a plurality of memory locations, where data is stored in parallel to the memory devices and retrieved in parallel from the memory devices; a first data switch connected to the data source and each of the memory devices, where the first data switch controls which data is stored to which memory device; and a second data switch connected to the data destination and each of the memory devices, where the second data switch controls providing data to the data destination according to the second order.

In another implementation, a method of storing pixel data in a checkerboard buffer includes: storing pixel data for a first pixel at a first memory address in a first memory device, where the first pixel is the first pixel in a first horizontal row of pixels in a frame; storing pixel data for a second pixel at the first memory address in a second memory device, where the second pixel is the second pixel in the first horizontal row of pixels in the frame; storing pixel data for a third pixel at the first memory address in a third memory device, where the third pixel is the third pixel in the first horizontal row of pixels in the frame; storing pixel data for a fourth pixel at a second memory address in the second memory device, where the fourth pixel is the first pixel in a second horizontal row of pixels in the frame; storing pixel data for a fifth pixel at the second memory address in the third memory device, where the fifth pixel is the second pixel in the second horizontal row of pixels in the frame; storing pixel data for a sixth pixel at the second memory address in the first memory device, where the sixth pixel is the third pixel in the second horizontal row of pixels in the frame; storing pixel data for a seventh pixel at a third memory address in the third memory device, where the seventh pixel is the first pixel in a third horizontal row of pixels in the frame; storing pixel data for an eighth pixel at the third memory address in the first memory device, where the eighth pixel is the second pixel in the third horizontal row of pixels in the frame; and storing pixel data for a ninth pixel at the third memory address in the second memory device, where the ninth pixel is the third pixel in the third horizontal row of pixels in the frame; where the first, second, and third pixels are vertically adjacent to the fourth fifth, and sixth pixels, respectively, and the fourth, fifth, and sixth pixels are vertically adjacent to the seventh, eighth, and ninth pixels, respectively.

In another implementation, a method of retrieving pixel data in a checkerboard buffer includes: retrieving pixel data for a first pixel from a first memory address in a first memory device, where the first pixel is the first pixel in a first horizontal row of pixels in a frame; retrieving pixel data for a second pixel from a second memory address in a second memory device, where the second pixel is the first pixel in a second horizontal row of pixels in the frame; retrieving pixel data for a third pixel from a third memory address in a third memory device, where the third pixel is the first pixel in a third horizontal row of pixels in the frame; retrieving pixel data for a fourth pixel from the first memory address in the second memory device, where the fourth pixel is the second pixel in the first horizontal row of pixels in the frame; retrieving pixel data for a fifth pixel from the second memory address in the third memory device, where the fifth pixel is the second pixel in the second horizontal row of pixels in the frame; retrieving pixel data for a sixth pixel from the third memory address in the first memory device, where the sixth pixel is the second pixel in the third horizontal row of pixels in the frame; retrieving pixel data for a seventh pixel from the first memory address in the third memory device, where the seventh pixel is the third pixel in the first horizontal row of pixels in the frame; retrieving pixel data for an eighth pixel from the second memory address in the first memory device, where the eighth pixel is the third pixel in the second horizontal row of pixels in the frame; and retrieving pixel data for a ninth pixel from the third memory address in the second memory device, where the ninth pixel is the third pixel in the third horizontal row of pixels in the frame; where the first, second, and third pixels are horizontally adjacent to the fourth fifth, and sixth pixels, respectively, and the fourth, fifth, and sixth pixels are horizontally adjacent to the seventh, eighth, and ninth pixels, respectively.

BRIEF DESCRIPTION OF THE DRAWINGS

FIG. 10 is a table showing the states for storing pixel data of a first data switch according to one implementation of the present invention.

FIG. 11 is a table showing the states for retrieving pixel data of a second data switch according to one implementation of the present invention.

FIG. 13 is a table of addresses and pixel numbers for storing a 1920×1080 frame of pixel data according to one implementation of the present invention.

DETAILED DESCRIPTION

The present invention provides methods and apparatus for storing and retrieving data in parallel, but in different orders, using three or more memory devices. This description focuses on implementations where the data is pixel data, however, the present invention is applicable to various types of data that can be accessed in two different orders. As described below, in one implementation, pixel data is stored according to a checkered pattern of pixels, sequentially among the memory devices. This pattern advantageously allows pixel data for three or more pixels to be stored in parallel following a horizontal row of pixels and pixel data for three or more pixels to be retrieved in parallel following a vertical column of pixels.

The description below is generally divided into two sections for clarity: A. Checkerboard Buffers; and B. Illustrative Implementations of Checkerboard Buffers.

A. Checkerboard Buffers

A checkerboard buffer provides storage of data in one order and retrieval of data in another order. A checkerboard buffer according to the present invention includes three or more memory devices for parallel storage and retrieval of data. For three memory devices, approximately one-third of the data is stored in each of the memory devices. Similarly, for four or more memory devices, approximately equal portions of the data are stored in each of the memory devices. As data elements are received, which data is stored to which memory device changes according to the difference between the order data is received and the order data is to be retrieved. The data is stored in the memory devices so that data can be stored to the devices in one order in parallel and retrieved from the devices in another order in parallel.

In some implementations using video data, the checkerboard buffer is a frame buffer for storing pixel data, such as a type of scan converter. Pixel data is supplied to the checkerboard buffer according to the horizontal order of pixels in a frame, such as from left to right, top to bottom. Pixel data is retrieved from the checkerboard buffer according to the vertical order of pixels in a frame, such as from top to bottom, left to right. Pixel data is stored and retrieved for a set of pixels at a time. A set of pixels includes one pixel for each memory device being accessed. For example, where pixel data is stored among three memory devices, pixel data for a first pixel is stored in one memory device, pixel data for a second pixel is stored in a second memory device, and pixel data for a third pixel is stored in a third memory device.

Figure 6A:
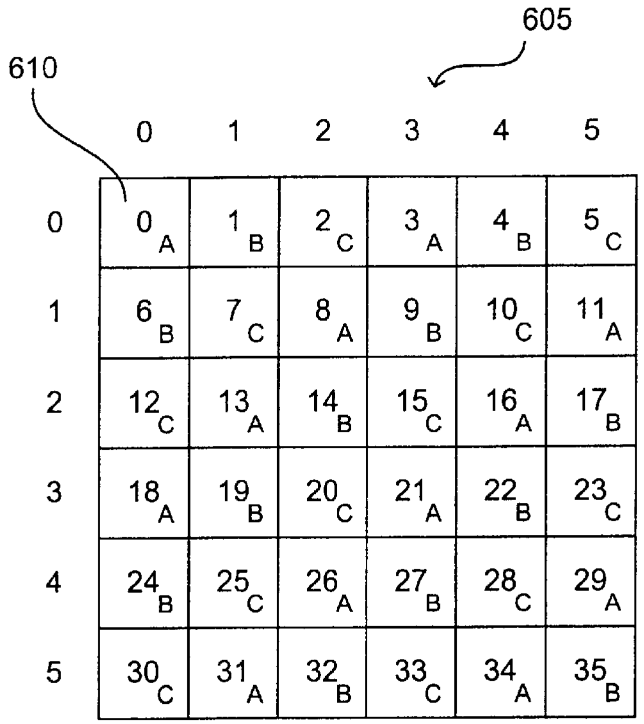
FIG. 6A is a representation of a frame of pixels divided among three memory devices according to one implementation of the present invention.
Figure 6B:
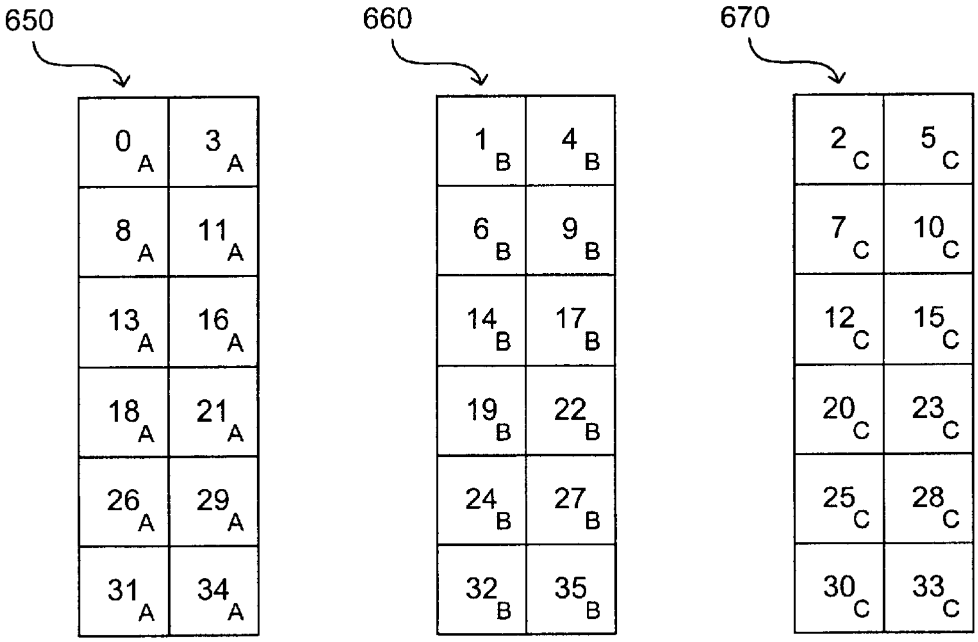
FIG. 6B is a representation of three memory devices according to one implementation of the present invention.

FIGS. 6A and 6B illustrate a checkerboard pattern of storage in three memory devices providing parallel storage and parallel retrieval. FIG. 6A is a representation of a frame 605 of pixels 610 divided among three memory devices. FIG. 6B is a representation of three memory devices: a first memory device 650, a second memory device 660, and a third memory device 670. Frame 605 has only 36 pixels for simplicity, but typical video frames have many more pixels. For example, one HD resolution has 2,073,600 pixels per frame (1080 horizontal rows with 1920 pixels per row). The description herein of checkerboard buffers focuses on this HD resolution, however, checkerboard buffers can be implemented for various resolutions (e.g., 1280×720, 640×480, etc.).

Each pixel 610 in frame 605 is numbered, starting with pixel 0 in the upper left of frame 605. Each horizontal row is numbered, with the uppermost horizontal row (i.e., pixels 0 . . . 5) numbered 0. Each vertical column is numbered, with the leftmost column (i.e., pixels 0, 6, 12, 18, 24, 30) numbered 0. In FIG. 6A, each pixel 610 is also labeled with a letter: A, B, or C. The letter indicates which memory device stores pixel data for that pixel. "A" indicates first memory device 650. "B" indicates second memory device 660. "C" indicates third memory device 670. The boxes in FIG. 6B are also labeled with letters to correspond with FIG. 6A.

Each box of memory devices 650, 660, and 670 represents a memory location. Each memory location stores pixel data for one pixel and is numbered according to the pixel that has pixel data stored in that memory location. Accordingly, pixel data is stored in memory devices 650, 660, and 670 in the patterns shown in FIG. 6B. Each memory location has an address. The upper left box represents the memory location having address 0, and addresses continue sequentially from left to right, top to bottom. For example, in FIG. 6B, pixel data for pixel 0 is stored at address 0 in memory device 650, pixel data for pixel 3 is stored at address 1, pixel data for pixel 8 is at address 2, and so on. One address can be used to access three memory locations by supplying the address to three memory devices, accessing one memory location in each memory device. For example, by supplying address 0 to memory devices 650, 660, and 670, pixel data can be stored in the first memory location of each memory device (i.e., pixel data for pixels 0, 1, and 2).

Pixel data for frame 605 would be supplied to the checkerboard buffer in horizontal pixel sets (i.e., three pixels at a time, one for each memory device) according to the horizontal rows of frame 605. For example, the checkerboard buffer would receive pixel data for pixels in frame 605 according to this sequence of pixel sets: 0-1-2, 3-4-5, 6-7-8, 9-10-11, 12-13-14, 15-16-17, 18-19-20, 21-22-23, 24-25-26, 27-28-29, 30-31-32, 33-34-35. The checkerboard buffer stores the pixel data using this sequence, for three pixels at a time, but changes which memory device receives which pixel data with each row. In rows numbered a multiple of three (e.g., 0, 3, . . . ), first memory device 650 receives and stores pixel data for the first pixel in the pixel set, second memory device 660 receives and stores pixel data for the second pixel in the pixel set, and third memory device 670 receives and stores pixel data for the third pixel in the pixel set. These rows have a pattern of A-B-C for the pixel sets. In rows numbered one more than a multiple of three (e.g., 1, 4, . . . ), first memory device 650 receives and stores pixel data for the third pixel in the pixel set, second memory device 660 receives and stores pixel data for the first pixel in the pixel set, and third memory device 670 receives and stores pixel data for the second pixel in the pixel set. These rows have a pattern of B-C-A for the pixel sets. In rows numbered two more than a multiple of three (e.g., 2, 5, . . . ), first memory device 650 receives and stores pixel data for the second pixel in the pixel set, second memory device 660 receives and stores pixel data for the third pixel in the pixel set, and third memory device 670 receives and stores pixel data for the first pixel in the pixel set. These rows have a pattern of C-A-B for the pixel sets.

For example, for the first pixel set in the first row of pixels (i.e., pixels 0-1-2 in row 0), first memory device 650 receives and stores pixel data for pixel 0. Second memory device 660 receives and stores pixel data for pixel 1. Third memory device 670 receives and stores pixel data for pixel 2. For pixel set 6-7-8 in row 1, first memory device 650 receives and stores pixel data for pixel 8. Second memory device 660 receives and stores pixel data for pixel 6. Third memory device 670 receives and stores pixel data for pixel 7. For pixel set 12-13-14 in row 2, first memory device 650 receives and stores pixel data for pixel 13. Second memory device 660 receives and stores pixel data for pixel 14. Third memory device 670 receives and stores pixel data for pixel 12. This pattern continues throughout frame 605. Accordingly, pixel data for the 36 pixels of frame 605 is stored in 12 locations in three memory devices (650, 660, and 670) in 12 parallel operations using horizontal rows. For a frame at HD resolution 1920×1080, pixel data for 2,073,600 pixels would be stored in 691,200 operations (640*1080).

Pixel data would be retrieved for frame 605 from the checkerboard buffer in vertical pixel sets (i.e., three pixels at a time, one for each memory device) according to the vertical columns of frame 605. For example, the checkerboard buffer would supply pixel data for pixels in frame 605 according to this sequence of pixel sets: 0-6-12, 18-24-30, 1-7-13, 19-25-31, 2-8-14, 20-26-32, 3-9-15, 21-27-33, 4-10-16, 22-28-34, 5-11-17, 23-29-35. The checkerboard buffer retrieves pixel data using this sequence, for three pixels at a time, but changes which memory device to access for which pixel data with each column. The pattern is similar for columns to the pattern for rows described above. In columns numbered a multiple of three (e.g., 0, 3, . . . ), first memory device 650 provides pixel data for the first pixel in the pixel set, second memory device 660 provides pixel data for the second pixel in the pixel set, and third memory device 670 provides pixel data for the third pixel in the pixel set. These columns have a pattern of A-B-C for the pixel sets. In columns numbered one more than a multiple of three (e.g., 1, 4, . . . ), first memory device 650 provides pixel data for the third pixel in the pixel set, second memory device 660 provides pixel data for the first pixel in the pixel set, and third memory device 670 provides pixel data for the second pixel in the pixel set. These columns have a pattern of B-C-A for the pixel sets. In columns numbered two more than a multiple of three (e.g., 2, 5, . . . ), first memory device 650 provides pixel data for the second pixel in the pixel set, second memory device 660 provides pixel data for the third pixel in the pixel set, and third memory device 670 provides pixel data for the first pixel in the pixel set. These columns have a pattern of C-A-B for the pixel sets.

For example, for the first pixel set in the first column of pixels (i.e., pixels 0-6-12 in column 0), first memory device 650 provides pixel data for pixel 0. Second memory device 660 provides pixel data for pixel 6. Third memory device 670 provides pixel data for pixel 12. For pixel set 1-7-13 in column 1, first memory device 650 provides pixel data for pixel 13. Second memory device 660 provides pixel data for pixel 1. Third memory device 670 provides pixel data for pixel 7. For pixel set 2-8-14 in column 2, first memory device 650 provides pixel data for pixel 8. Second memory device 660 provides pixel data for pixel 14. Third memory device 670 provides pixel data for pixel 8. This pattern continues for the rest of frame 605. Accordingly, pixel data for the 36 pixels of frame 605 is retrieved from 12 locations in three memory devices (650, 660, and 670) in 12 parallel operations using vertical columns. For a frame at HD resolution 1920×1080, pixel data for 2,073,600 pixels would be retrieved in 691,200 operations (360*1920).

Figure 1A:
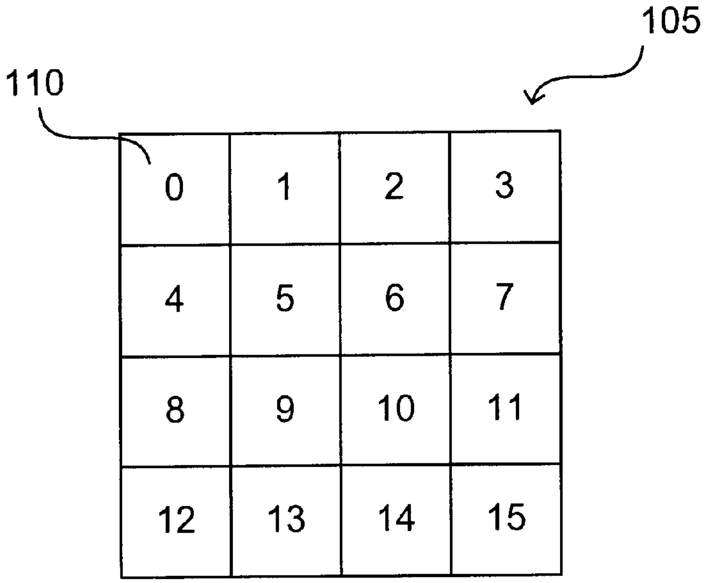
FIG. 1A is a representation of a screen as a grid of pixels.
Figure 1B:
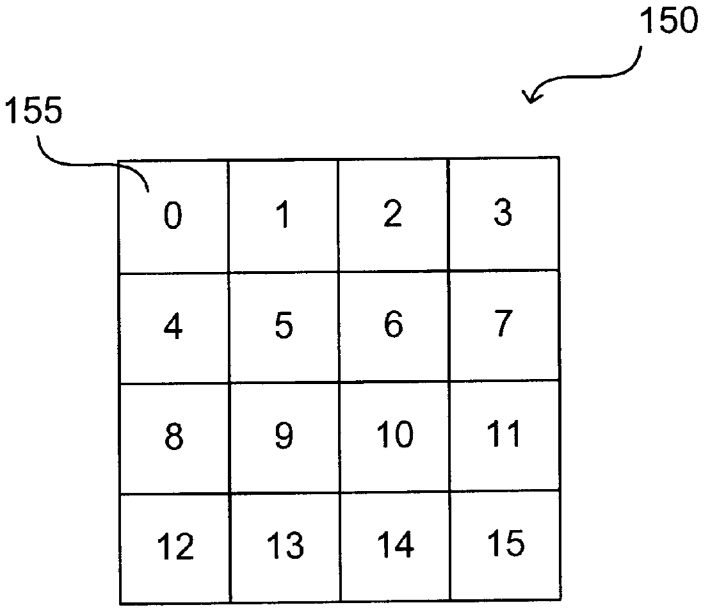
FIG. 1B is a representation of a frame buffer as a grid of memory locations.
Figure 2:
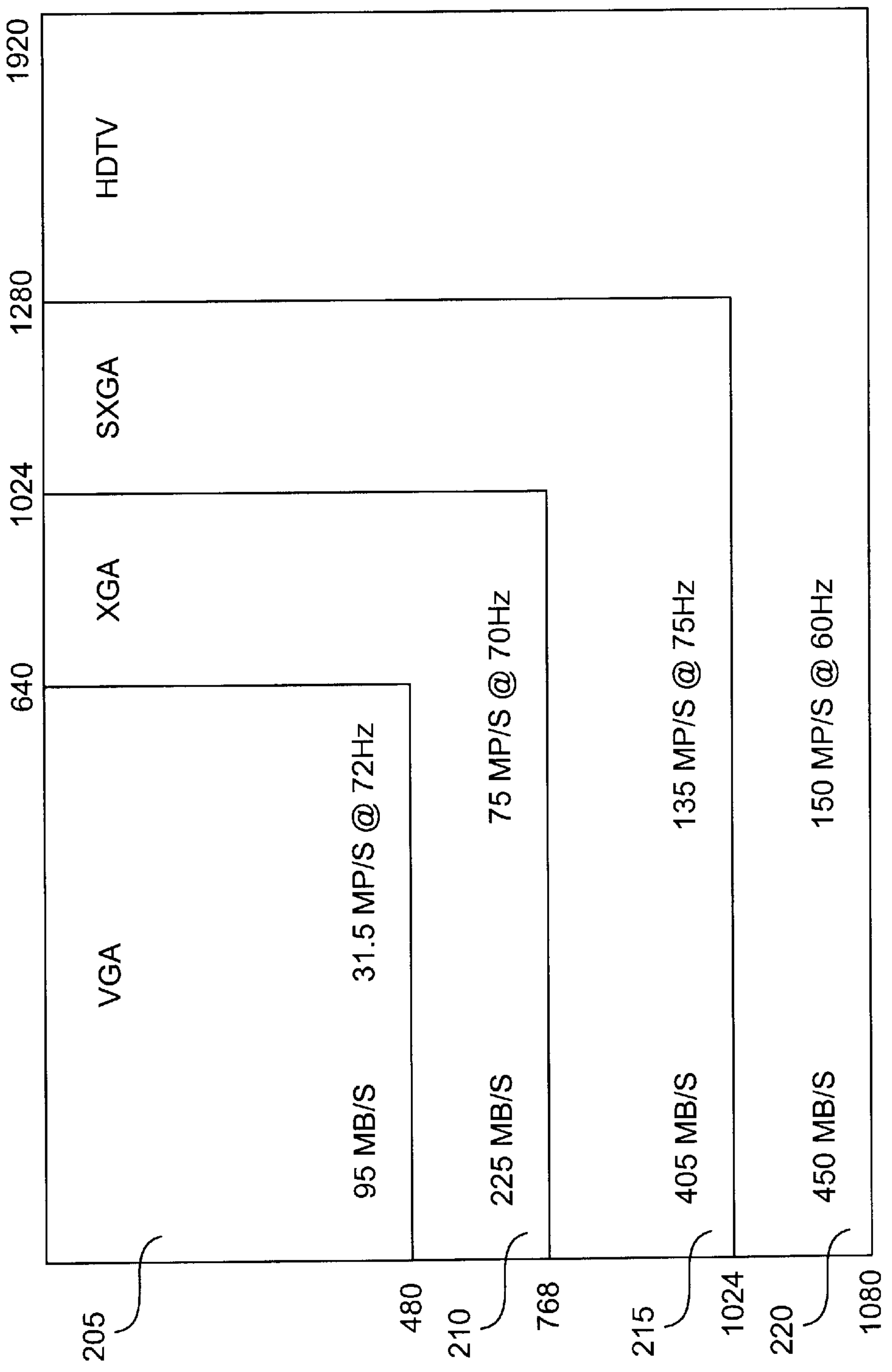
FIG. 2 is a representation of screen resolutions and typical data throughput requirements.
Figure 3A:
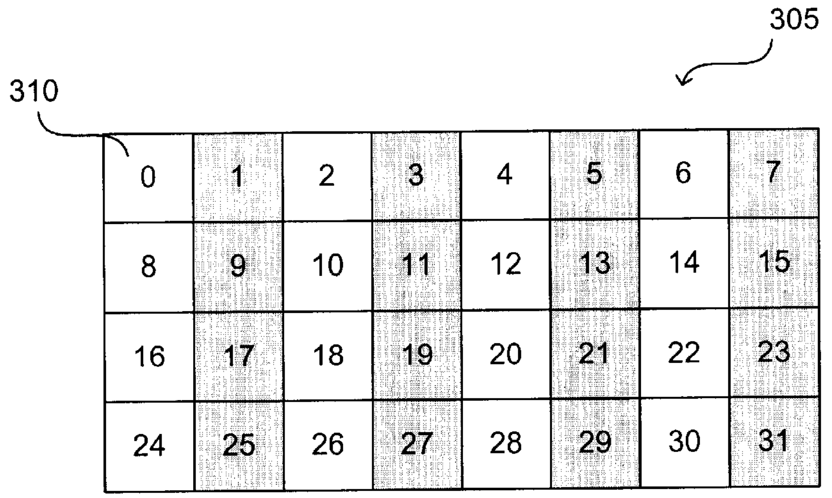
FIG. 3A is a representation of a frame of pixels divided between two memory devices.
Figure 3B:
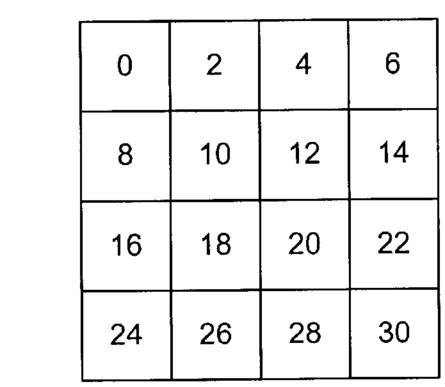
FIG. 3B is a representation of a first memory device.
Figure 3C:
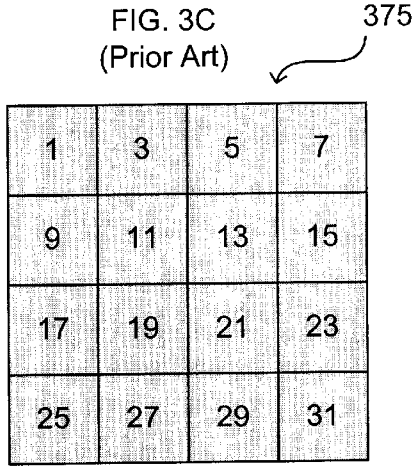
FIG. 3C is a representation of a second memory device.
Figure 4:
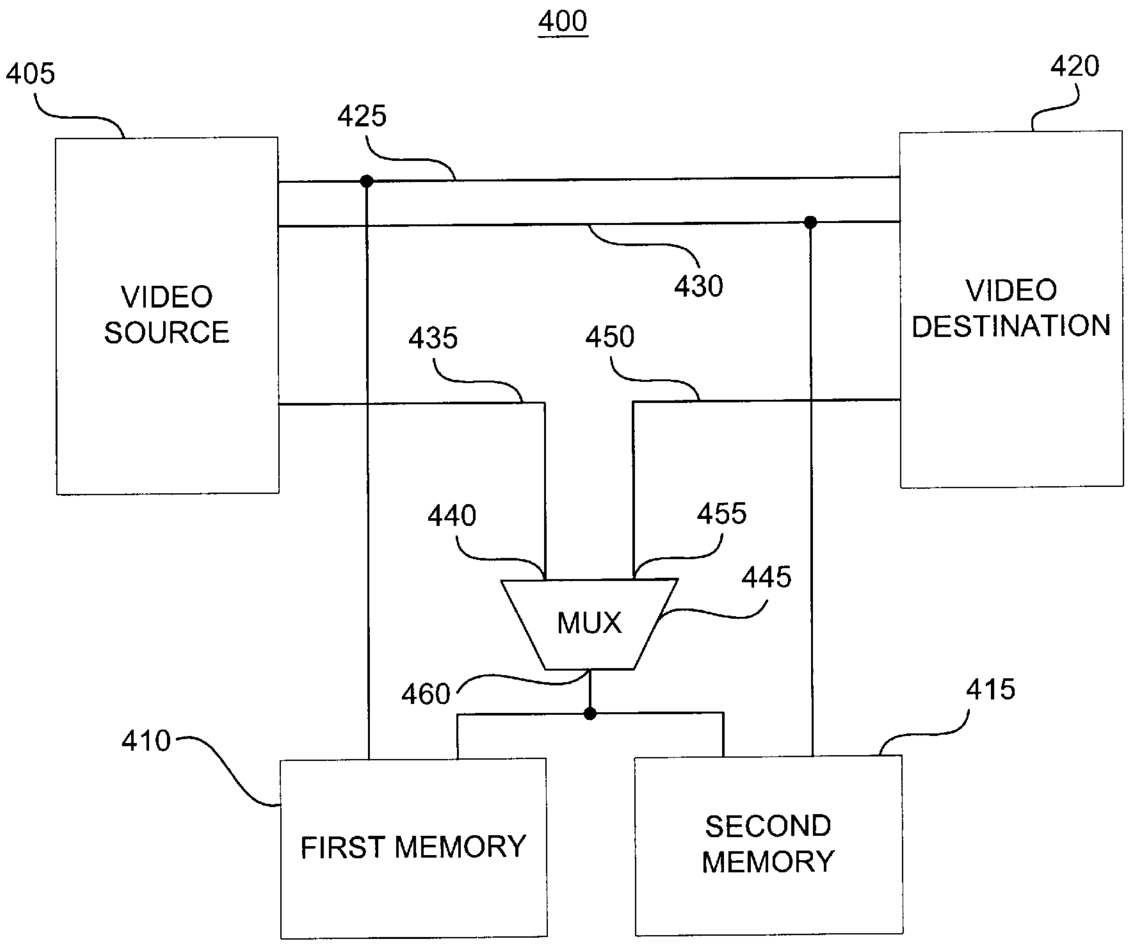
FIG. 4 is a block diagram of a dual pixel frame buffer architecture supporting the representations shown in FIGS. 3A, 3B, and 3C.
Figure 5:
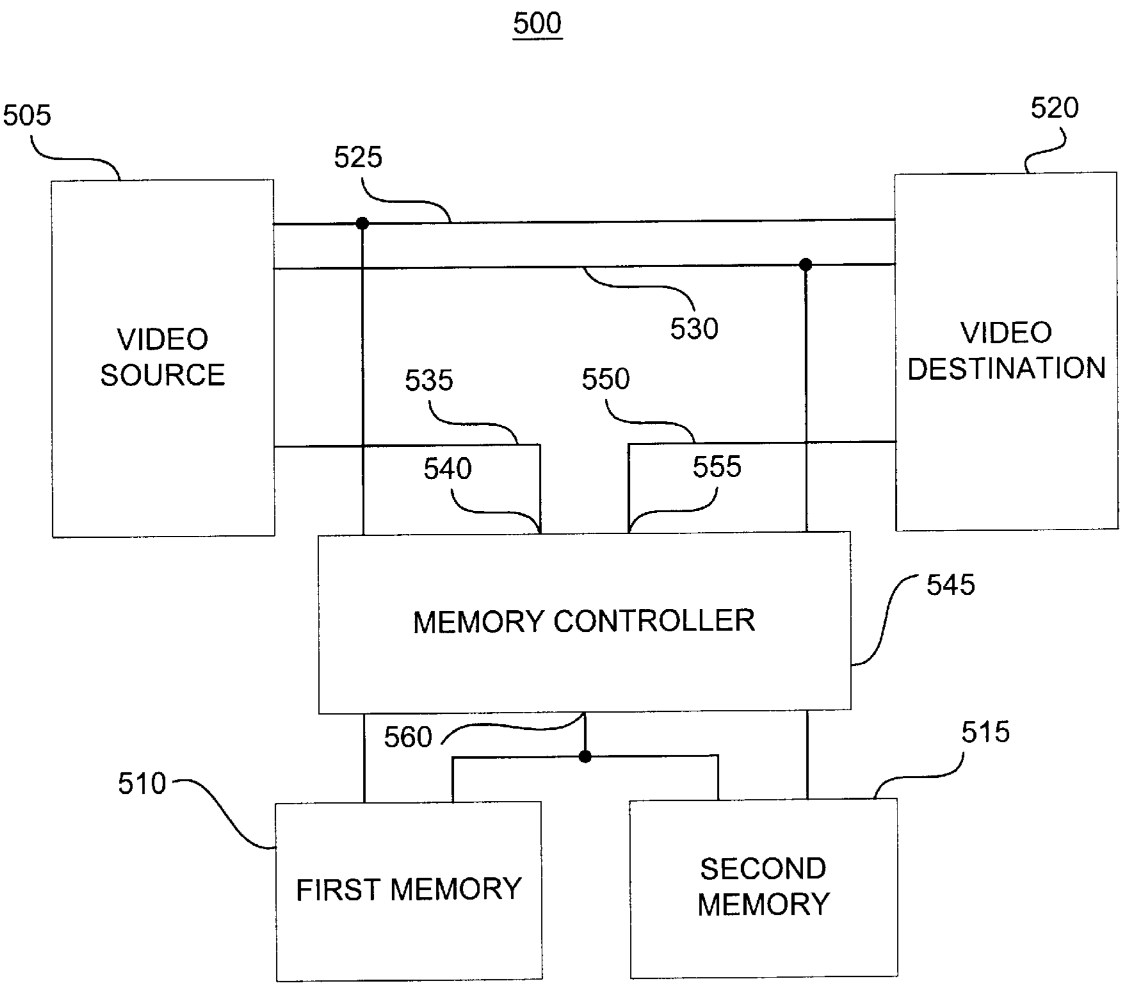
FIG. 5 is a block diagram of a dual pixel frame buffer architecture including a memory controller.

By comparison, in the storage pattern shown in FIGS. 3A, 3B, and 3C, while pixel data for pixels 0 and 1 can be retrieved in parallel from different memory devices, pixel data for pixels 0 and 8 cannot. Pixel data for pixels 0 and 8 is stored in the same device, first memory device 350 in FIG. 3B. The checkerboard buffer allows parallel storage for horizontal rows of pixels and parallel retrieval for vertical columns of pixels because the pixel data for each horizontal row of pixels is divided among multiple memory devices and the pixel data for each vertical column of pixels is also divided among multiple memory devices.

Figure 7A:
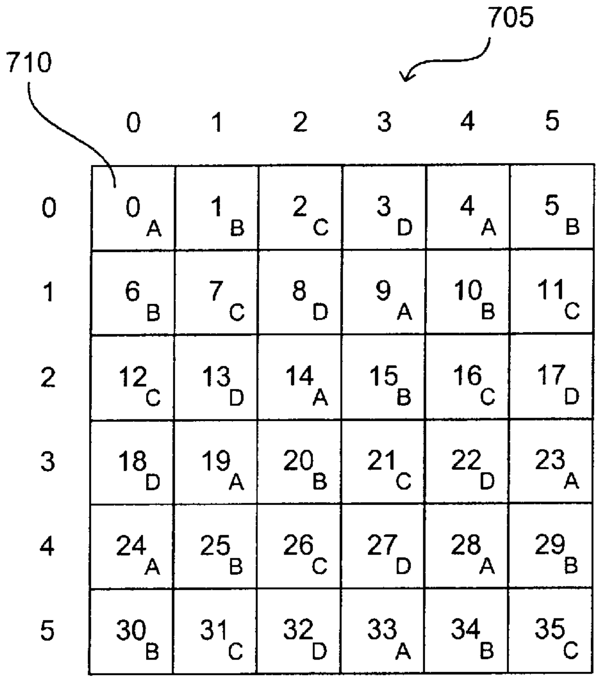
FIG. 7A is a representation of a frame of pixels divided among four memory devices according to one implementation of the present invention.
Figure 7B:
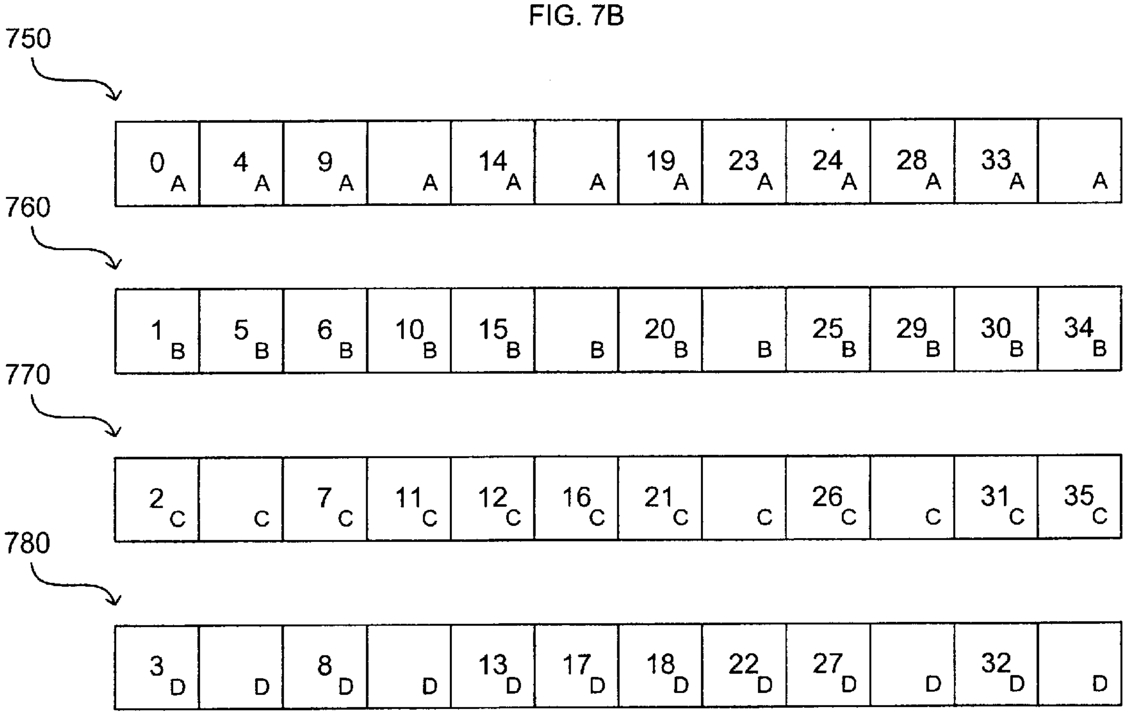
FIG. 7B is a representation of four memory devices according to one implementation of the present invention.

FIGS. 7A and 7B illustrate another checkerboard pattern of storage in four memory devices. FIG. 7A is a representation of a frame 705 of pixels 710 divided among four memory devices. Similar to FIG. 6A, each pixel 710 in frame 705 is labeled with a pixel number (starting from 0 in the upper left) and with a letter (A, B, C, D) indicating which of four memory devices stores pixel data for the pixel. Similar to FIG. 6B, FIG. 7B is a representation of four memory devices: a first memory device 750, a second memory device 760, a third memory device 770, and a fourth memory device 780. Each box in FIG. 7B represents a memory location as in FIG. 6B, however, the boxes in FIG. 7B are arranged horizontally to show an alternative perspective. The leftmost box represents the memory location having address 0, and addresses continue sequentially from left to right. For example, pixel data for pixel 0 is stored in the memory location having address 0 in first memory device 750, and pixel data for pixel 14 is stored at address 4.

Some of the boxes in FIG. 7B do not have a number. These boxes represent memory locations that are allocated but do not have corresponding pixels in the frame. These memory locations are unused or store alternative data, such as blank data (e.g., 0's). Memory locations are allocated for each row of pixels according to the smallest multiple of four (because four memory devices are used) that accommodates all the pixels in the row. In frame 705, a horizontal row of pixels 710 includes six pixels. Accordingly, eight memory locations are allocated, two memory locations in each device. During a clock cycle, four pixels can be stored to the four memory devices 750, 760, 770, 780 using a single address. Because six is not a multiple of four, pixel data for less than four pixels is stored at the end of each row of pixels (i.e., for two pixels). Memory locations are allocated equally in the memory devices in order to store pixel data for the pixels of the next row at the same address in each memory device. In an implementation where the number of pixels in a row is a multiple of the number of memory devices used for storing pixel data, all of the allocated memory locations can be used. For example, for a frame at HD resolution 1920×1080, 1920 is a multiple of four.

In addition, the number of rows in frame 705 is not a multiple of four. Accordingly, the memory devices do not have the same number of corresponding pixels. For example, first memory device 750 stores pixel data for nine pixels and second memory device 760 stores pixel data for ten pixels. However, as noted above, each memory device has the same number of memory locations allocated (i.e., two memory locations for each row of pixels, for a total of twelve memory locations allocated in each memory device). In an alternative implementation, a total number of memory locations is allocated for a number of rows of pixels equal to the smallest multiple of four that accommodates a column of pixels. For example, in frame 705, a column of pixels has six pixels so memory locations for a total of eight rows (i.e., accommodating a column of up to eight pixels) could be allocated.

The checkerboard pattern using four memory devices operates similarly to that using three memory devices. The sequence of pixels to be stored follows the horizontal rows of the frame (e.g., 0, 1, 2, 3, 4, . . . ) and the sequence of pixels to be retrieved follows the vertical columns of the frame (e.g., 0, 6, 12, 18, . . . ).

Pixel data for up to four pixels is stored during each clock cycle. During one clock cycle, only pixel data for pixels in the same row are stored to the memory devices. For frame 705, pixel data would be stored following this sequence: 0-1-2-3, 4-5, 6-7-8-9, 10-11, 12-13-14-15, 16-17, 18-19-20-21, 22-23, 24-25-26-27, 28-29, 30-31-32-33, 34-35. During some clock cycles, two memory devices do not store pixel data because the end of the row has been reached and there are less than four pixels remaining. In one implementation, blank data (e.g., 0's) is stored to these memory devices instead. Pixel data for 36 pixels would be stored in 12 operations (2*6). For a frame at HD resolution 1920×1080, pixel data for 2,073,600 pixels would be stored in 518,400 operations (480*1080).

For example, in storing pixel data for the first row of pixels 710 in frame 705, during the first clock cycle pixel data for pixels 0-1-2-3 (A-B-C-D) is stored to the first memory locations (i.e., address 0) of memory devices 750, 760, 770, 780, respectively. During the second clock cycle pixel data for pixels 4-5 (A-B) is stored to the second memory locations of memories 750, 760, respectively. Pixel data is not stored to third and fourth memory devices 770, 780 during the second clock cycle. In one implementation, blank data is stored to third and fourth memory devices 770, 780 during the second clock cycle. During the third clock cycle, pixel data for pixels 6-7-8-9 (B-C-D-A) is stored to the third memory locations of memory devices 760, 770, 780, 750 respectively. In this way, each of the four memory devices 750, 760, 770, 780 is accessed during each clock cycle, but pixel data is not necessarily stored to all memory devices with each clock cycle.

Similarly, pixel data for up to four pixels is retrieved during each clock cycle. During one clock cycle, only pixel data for pixels in the same column are retrieved from the memory devices. For frame 705, pixel data would be retrieved following this sequence: 0-6-12-18, 24-30, 1-7-13-19, 25-31, 2-8-14-20, 26-32, 3-9-15-21, 27-33, 4-10-16-22, 28-34, 5-11-17-23, 29-35. During some clock cycles, pixel data is not retrieved from two memory devices because the end of the column has been reached and there are less than four pixels remaining. In one implementation, unused addresses are provided to these memory devices, and the memory devices do not provide pixel data. Pixel data for 36 pixels would be retrieved in 12 operations (2*6). For a frame at HD resolution 1920×1080, pixel data for 2,073,600 pixels would be retrieved in 518,400 operations (270*1920).

For example, in retrieving pixel data for the first column of pixels 710 in frame 705, during the first clock cycle pixel data for pixels 0-6-12-18 (A-B-C-D) is retrieved from memory devices 750, 760, 770, 780. As described above, pixel data for vertically adjacent pixels are not stored at the same address so four different addresses are provided to memory devices 750, 760, 770, 780. For pixels 0-6-12-18 in frame 705, addresses 0-2-4-6 (A-B-C-D) are used. During the second clock cycle pixel data for pixels 24-30 (A-B) is retrieved from addresses 8 and 10 of first memory device 750 and second memory device 760, respectively. For convenience in addressing, addresses 12 and 14 can be provided to third and fourth memory devices 770, 780, respectively, but these locations are not accessed and have not been allocated. In alternative implementations, these locations can be allocated but not used, similar to the unused locations allocated for the horizontal rows. In addition, addresses 12 and 14 are not necessarily generated in all implementations.

A similar pattern of storage can be applied to a frame having an HD resolution of 1920×1080. In an implementation using four memory devices, a row of pixels would be stored in 480 operations, four pixels at a time. 1920 is a multiple of four, so unused memory locations need not be allocated (though, as described below, additional memory locations may be allocated so that the address for the first pixel in each row is a power of two). A column of pixels would be retrieved in 270 operations, four pixels at a time.

Figure 8:
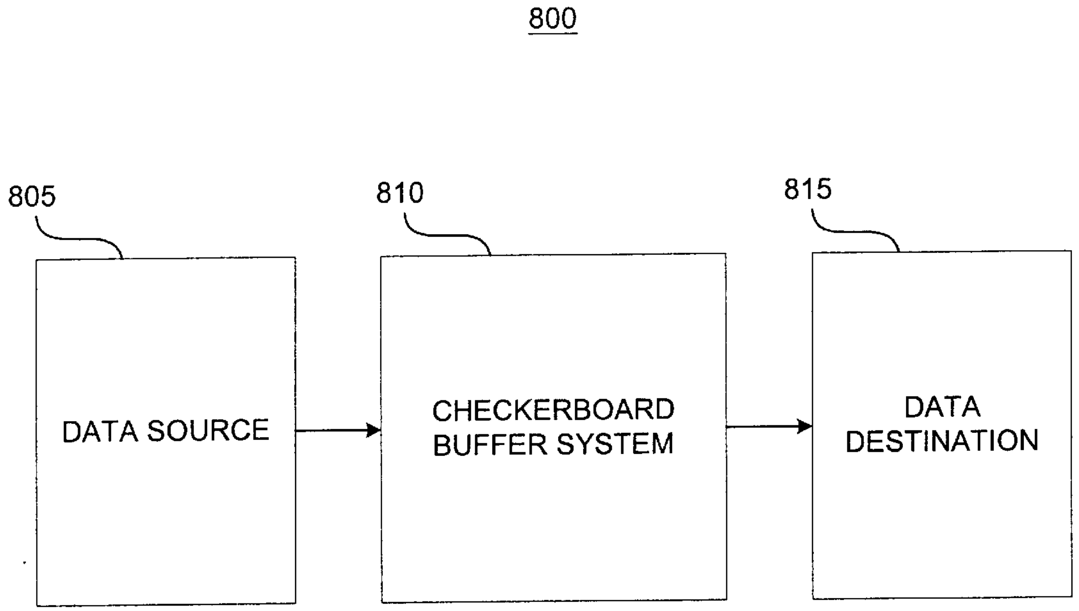
FIG. 8 is a block diagram of a data system according to one implementation of the present invention.

FIG. 8 is a block diagram of a data system 800. A data source 805 provides data to a checkerboard buffer system 810 in a first order. Checkerboard buffer system 810 stores the data in a checkerboard pattern, as described above. Checkerboard buffer system 810 retrieves the data in a second order and provides the retrieved data to a data destination 815.

Data source 805 can be a video source providing pixel data to checkerboard buffer system 810 and data destination 815 can be a display system. In this case, data source 805 provides pixel data according to horizontal rows of pixels and data destination 815 receives pixel data according to vertical columns of pixels, as described above. Checkerboard buffer system 810 provides the conversion.

Data source 805 can be implemented to provide pixel data according to various screen resolutions, such as a high definition ("HD") resolution of 1920×1080. While the discussion herein focuses on this HD resolution, alternative implementations can accommodate other resolutions. For an HD resolution signal, data source 805 provides pixel data for a progressive signal (e.g., 1920×1080p). Data source 805 can be implemented to receive an interlaced signal (e.g., 1920×1080i) and provide a progressive signal, such as by merging interlaced fields. In an alternative implementation, data source 805 provides an interlaced signal, providing pixel data for half the screen pixels (i.e., first field) and then pixel data for the other half (i.e., second field). In another implementation, data source 805 provides pixel data using progressive segmented frames ("PSF," by Sony Corporation of Japan, Inc.).

Each pixel has 32 bits of pixel data. In one implementation, 11 bits are for red, 11 bits are for green, and 10 bits are for blue. Alternative implementations may have different allocations (e.g., 10 bits per color) or pixel depths (e.g., 8 or 24 bits per pixel). Where data source 805 provides pixel data at 1920×1080p and 32 bits per pixel, the pixel rate is approximately 150 MP/S and the data rate from data source 805 is approximately 600 MB/S. Accordingly, checkerboard buffer system 810 stores pixel data from data source 805 at a data rate of approximately 600 MB/S. To provide pixel data at a rate to support the same resolution, 1920×1080p, checkerboard buffer system 810 outputs pixel data to data destination 815 at a data rate of approximately 600 MB/S.

Data destination 815 can be a GLV system. One color GLV system includes three GLV's: one for red, one for green, and one for blue. As described above, a GLV uses vertical columns of pixels to form an image (projecting one column at a time, typically left to right). In a color GLV system, each GLV projects a column of pixels (e.g., 1088 pixels, though only 1080 may have corresponding pixel data from the video data source) at a time. The three color columns are combined (such as using mirrors and lenses) to form a single apparent column on the viewing area (not shown in FIG. 8). Accordingly, it is advantageous for the GLV system to receive pixel data according to vertical columns of pixels, rather than horizontal rows. Checkerboard buffer system 810 provides the pixel data to the GLV system corresponding to vertical columns of pixels. In alternative video implementations, data destination 815 can be some other video device that uses pixel data corresponding to vertical columns of pixels, such as a graphics card or a video image processor (e.g., for image transformations).

B. Illustrative Implementations of Checkerboard Buffers

This section describes several additional illustrative implementations of checkerboard buffers. However, the described implementations are illustrative and those skilled in art will readily appreciate additional implementations are possible. The illustrative implementations are described in separate numbered and labeled sections. However, compatible aspects of the implementations can be combined in additional implementations.

1. Checkerboard Frame Buffer Using Four Memory Devices

Figure 9:
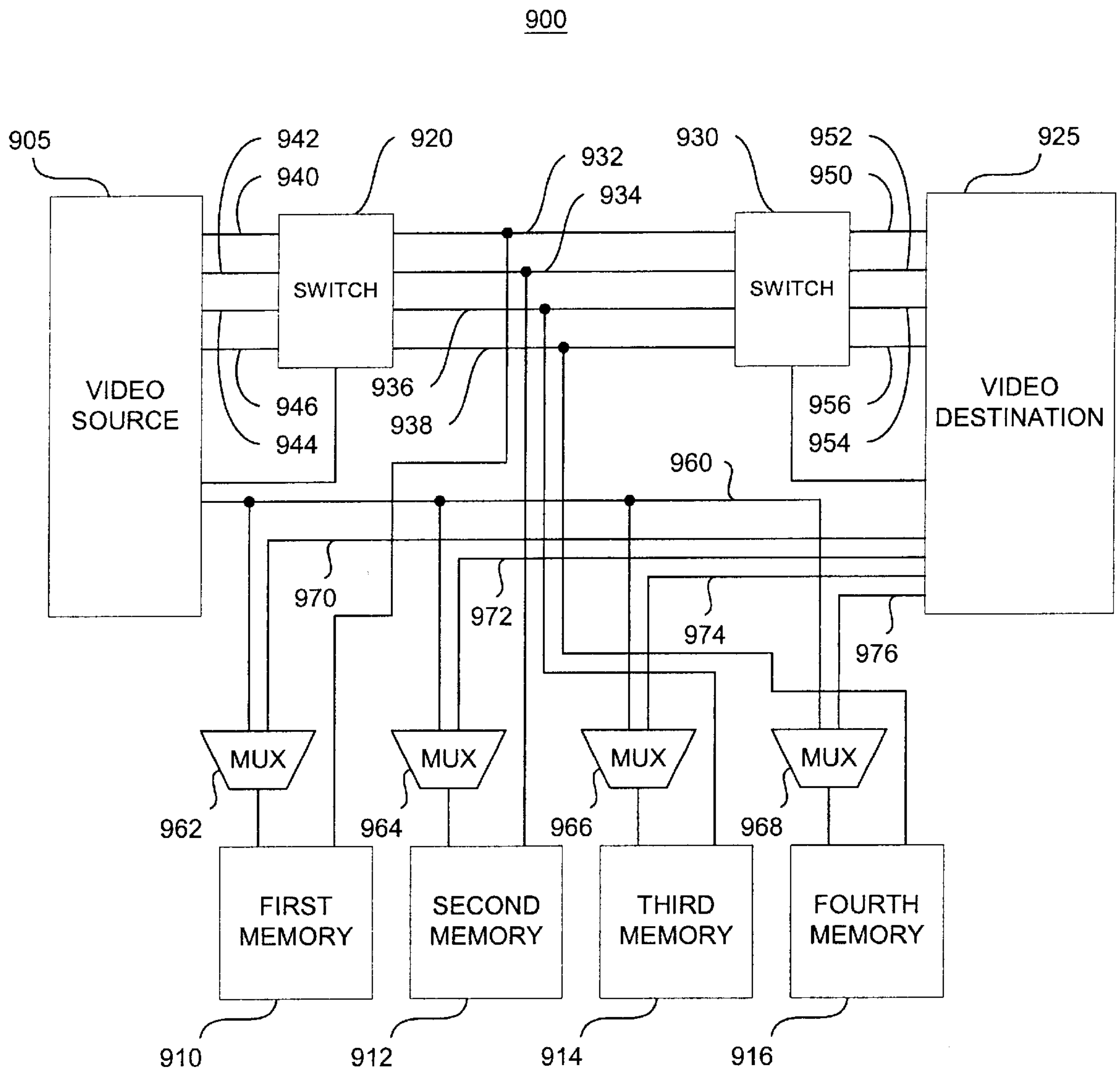
FIG. 9 is a block diagram of a switching dual pixel frame buffer architecture according to one implementation of the present invention.

FIG. 9 is a block diagram of a switching dual pixel frame buffer architecture 900 supporting the representations shown in FIGS. 7A and 7B. Architecture 900 can implement checkerboard buffer system 810 in FIG. 8. A video source 905 provides pixel data to a first memory 910, a second memory 912, a third memory 914, and a fourth memory 916 (e.g., memory devices 750, 760, 770, and 780, respectively, in FIG. 7B) in parallel through a first data switch 920. A video destination 925 retrieves pixel data from first memory 910, second memory 912, third memory 914, and fourth memory 916 in parallel through a second data switch 930.

Each of memories 910, 912, 914, 916 is a separate memory device, such as 32-bit wide 8 MB SDRAM's (e.g., 2M×32 SDRAM MT48LC2M32B2 by Micron Technology, Inc.). The SDRAM is preferably fast enough to support the data rate needed for the screen resolution, such as 150 MHz or 166 MHz. Other types of memory can also be used, such as SGRAM (synchronous graphics RAM). Memories 910, 912, 914, 916 each store approximately one-quarter of the pixel data of a particular frame (depending on the resolution), one-quarter for each row of pixels and one-quarter for each column of pixels. In this implementation, pixel data for each pixel is stored in a separately addressable 32-bit memory location, 32 bits per pixel.

Data switches 920 and 930 switch connections to switch properly among memories 910, 912, 914, 916, as described below. Data switches 920 and 930 provide the checkerboard pattern of storage by controlling the order of pixels for which pixel data is stored or retrieved. A first data bus 932 is connected to first memory 910, first data switch 920, and second data switch 930. A second data bus 934 is connected to second memory 912, first data switch 920, and second data switch 930. A third data bus 936 is connected to third memory 914, first data switch 920, and second data switch 930. A fourth data bus 938 is connected to fourth memory 916, first data switch 920, and second data switch 930.

Video source 905 receives video data from another source (not shown), such as data source 805 in FIG. 8, a broadcast source, or a software application running on a computer system connected to video source 905. Video source 905 outputs pixel data for pixels up to four at a time, a first pixel on a first source bus 940, a second pixel on a second source bus 942, a third pixel on a third source bus 944, and a fourth pixel on a fourth source bus 946. In a resolution where pixel data for four pixels is not available at the end of a row of pixels, video source 905 provides alternative data on the buses that lack pixel data, such as blank data (e.g., all 0's). Alternatively, first data switch 920 provides the alternative data. At HD resolution 1920×1080, a row of pixels has 1920 pixels and divides evenly into four parts of 480 pixels, so alternative data is not needed.

First data switch 920 has four states to control which pixel data to provide to which memory. FIG. 10 is a table 1000 showing the states for storing pixel data of first data switch 920. Table 1000 shows four states: A, B, C, D. For each state, table 1000 indicates which pixel data first data switch 920 provides to each of the four memories 910, 912, 914, 916. The numbers in table 1000 each indicate a pixel in a four pixel set, where "1" indicates the first pixel, and so on. First data switch 920 provides pixel data to memories 910, 912, 914, 916 corresponding to the numbers of pixels in table 1000. For example, in state A, first data switch 920 provides pixel data for the first pixel in the four pixel set to first memory 910 (indicated by the "1" corresponding to state A and the first memory), the second pixel (indicated by a "2") to second memory 912, the third pixel to third memory 914, and the fourth pixel to fourth memory 916. First data switch 920 begins in state A for the first row of the frame and cycles through states A, B, C, D, changing with each row of pixels.

Returning to FIG. 9, video source 905 provides a control signal to first data switch 920 to control the state of first data switch 920. This control signal can be based on the address provided by video source 905 for storing pixel data (such as address bit A9, as described below), or linked to the horizontal synchronization signal for the frame received by video source 905. In another implementation, video source 905 can provide all or part of the address to first data switch 920 for state control. In this way, the state of first data switch 920 changes with each horizontal row of pixels.

Video destination 925 provides pixel data to a display system, such as data destination 815 in FIG. 8 implemented as a GLV system. Video destination 925 receives pixel data for up to four pixels at a time, a first pixel on a first destination bus 950, a second pixel on a second destination bus 952, a third pixel on a third destination bus 954, and a fourth pixel on a fourth destination bus 956. Video destination 925 receives pixel data from second data switch 930. In a resolution where pixel data for four pixels is not available at the end of a column of pixels, second data switch 930 provides alternative data on the buses that lack pixel data, such as blank data (e.g., all 0's). Alternatively, memories 910, 912, 914, 916 store alternative data for these extra rows of pixels and so memories 910, 912, 914, 916 provide the alternative data. At HD resolution 1920×1080, a column of pixels has 1080 pixels and divides evenly into four parts of 270 pixels, so alternative data is not needed.

Similar to first data switch 920, second data switch 930 has four states to control which pixel data to provide to which destination bus and so to video destination 925. FIG. 11 is a table 1100, similar to table 1000 in FIG. 10, showing the states for retrieving pixel data of second data switch 930. Table 1100 shows four states: A, B, C, D. For each state, table 1100 indicates which pixel data second data switch 930 provides to each of the four destination buses 950, 952, 954, 956. The numbers in table 1100 each indicate a pixel in a four pixel set, where "1" indicates the first pixel, and so on. Second data switch 930 provides pixel data to destination buses 950, 952, 954, 956 corresponding to the numbers of pixels in table 1100. For example, in state A, second data switch 930 provides pixel data for the first pixel to first destination bus 950 (indicated by the "1" corresponding to state A and the first memory), the second pixel (indicated by a "2") to second destination bus 952, the third pixel to third destination bus 954, and the fourth pixel to fourth destination bus 956. Second data switch 930 begins in state A for the first column of the frame and cycles through states A, B, C, D, changing with each column of pixels. As described below, the state for retrieving pixel data is also related to generating addresses for retrieving pixel data.

Returning to FIG. 9, video destination 925 provides a control signal to second data switch 930 to control the state of second data switch 930. This control signal can be based on the address provided by video destination 925 for retrieving pixel data (such as bit C0 from a column counter, as described below). In another implementation, video destination 925 can provide all or part of the address to second data switch 930 for state control. In this way the state of second data switch 930 changes with each vertical column of pixels.

A source address bus 960 is connected to video source 905, a first address multiplexor 962, a second address multiplexor 964, a third address multiplexor 966, and a fourth address multiplexor 968. A first destination address bus 970 is connected to video destination 925 and first address multiplexor 962. A second destination address bus 972 is connected to video destination 925 and second address multiplexor 964. A third destination address bus 974 is connected to video destination 925 and third address multiplexor 966. A fourth destination address bus 976 is connected to video destination 925 and fourth address multiplexor 968. First address multiplexor 962 is connected to first memory 910. Second address multiplexor 964 is connected to second memory 912. Third address multiplexor 966 is connected to third memory 914. Fourth address multiplexor 968 is connected to fourth memory 916. Accordingly, the same address is provided by video source 905 to each of first memory 910, second memory 912, third memory 914, and fourth memory 916 to store pixel data. Different addresses are provided by video destination 925 to each of first memory 910, second memory 912, third memory 914, and fourth memory 916 to retrieve data. Address multiplexors 962, 964, 966, 968 receive control signals at control inputs (not shown) to control which input is connected to the output, and so which address is provided to the connected memory. Memories 910, 912, 914, 916 also receive control signals at control inputs (not shown) to control whether memories 910, 912, 914, 916 will read in data (write mode) or read out data (read mode). In addition, while clock lines are not shown in FIG. 9, architecture 900 operates based on clock cycles so that pixel data can be processed for up to four pixels per clock cycle in support of the desired pixel rate.

Figure 12:
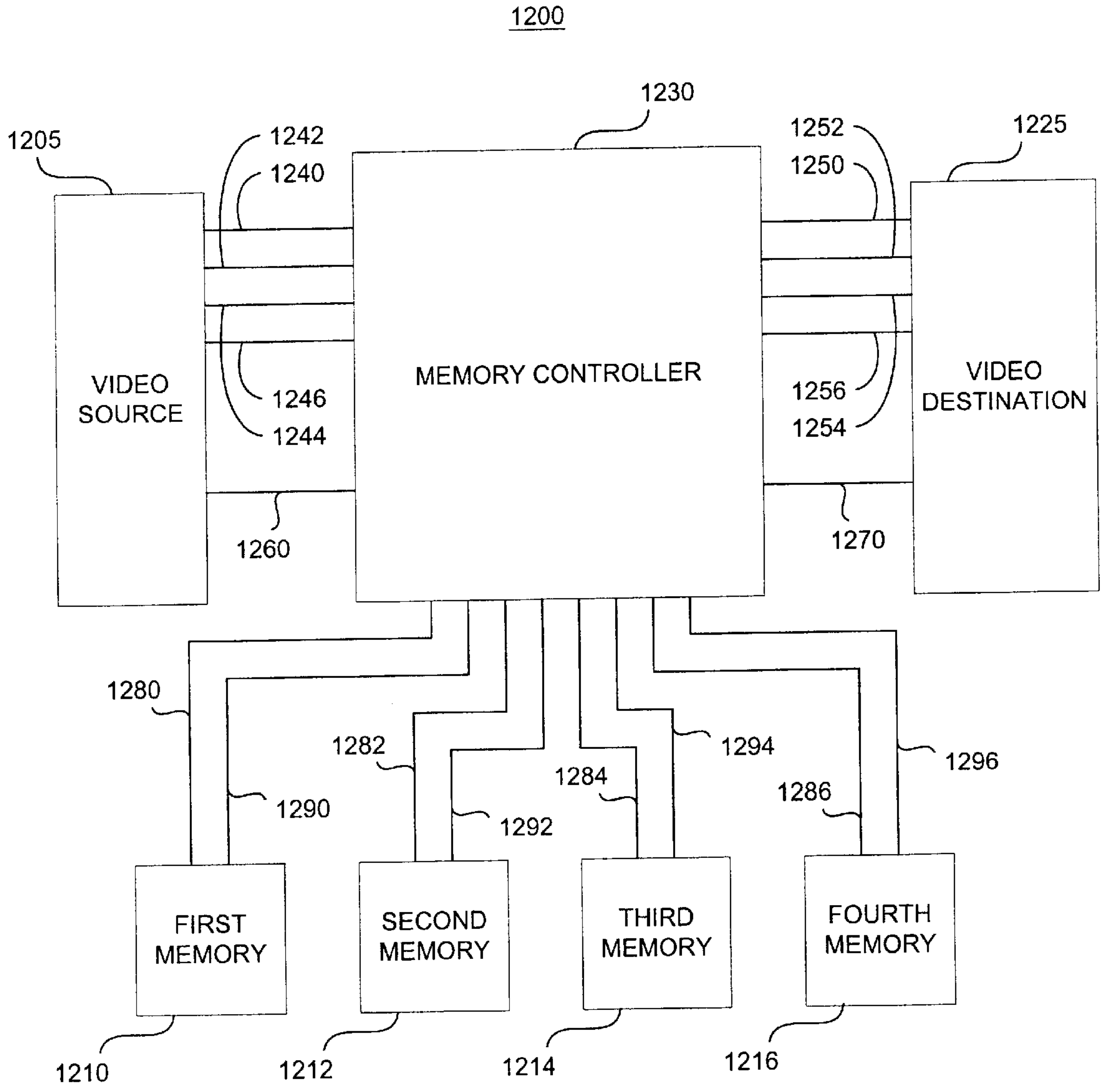
FIG. 12 is a block diagram of a switching dual pixel frame buffer architecture including a memory controller according to one implementation of the present invention.

In another implementation, address generation and switching can be controlled by a memory controller. FIG. 12 is a block diagram of a switching dual pixel frame buffer architecture 1200 including a memory controller 1230. Architecture 1200 is similar to architecture 900 of FIG. 9, but memory controller 1230 provides data switch and address generation functionality. Memory controller 1230 replaces data switches 920 and 930, and replaces address multiplexors 962, 964, 966, 968. Memory controller 1230 receives pixel data from video source 1205 on source buses 1240, 1242, 1244, 1246 to store in memories 1210, 1212, 1214, 1216. Memory controller 1230 retrieves pixel data from memories 1210, 1212, 1214, 1216 and provides the pixel data to video destination 1225 on destination buses 1250, 1252, 1254, 1256. Memory controller 1230 provides pixel data to and retrieves pixel data from memories 1210, 1212, 1214, 1216 through memory data buses 1280, 1282, 1284, 1286, respectively. Memory controller 1230 provides data to memories 1210, 1212, 1214, 1216 and to destination buses 1250, 1252, 1254, 1256 according to states, as described above referring to data switches 920 and 930 and tables 1000, 1100 in FIGS. 9, 10, and 11. Memory controller 1230 generates and provides addresses along with control signals to memories 1210, 1212, 1214, 1216 on memory address buses 1290, 1292, 1294, 1296, respectively. Memory controller 1230 receives signals from video source 1205 and video destination 1225 through control lines 1260 and 1270, respectively, indicating whether pixel data is to be stored to or retrieved from memories 1210, 1212, 1214, 1216. Accordingly, memory controller 1230 controls address generation and where pixel data for each pixel is sent (similar to data switches 920 and 930 of FIG. 9). In addition, as noted above with respect to FIG. 9, architecture 1200 operates based on clock cycles so that pixel data can be processed for up to four pixels per clock cycle in support of the desired pixel rate.

In operation, memories 1210, 1212, 1214, 1216 read in or store complementary portions of a frame of pixels as pixel data from video source 1205 and output the pixel data to video destination 1225. Operation of architecture 900 in FIG. 9 is similar to that of architecture 1200 with address generation and data switching distributed among video source 905, video destination 925, and data switches 920, 930. Memory controller 1230 ensures the proper alternation of connections to memories 1210, 1212, 1214, 1216 to provide a checkerboard pattern, as represented in FIG. 7A. As described above, pixel data for a frame of pixels from video source 1205 is stored according to horizontal rows of pixels, and then the pixel data is retrieved according to vertical columns of pixels and provided to video destination 1225. After the pixel data for the entire frame has been retrieved, pixel data for the next frame is stored, and so on. Some pixel data for the next frame may be buffered, such as in video source 1205, while pixel data for the previous frame is being retrieved. As described below, in alternative implementations, the storage and retrieval can be interleaved or occur in parallel.

Referring to FIGS. 7A, 7B, and 12, for frame 705, video source 1205 would supply pixel data for horizontal pixel sets on source buses 1240, 1242, 1244, 1246 in this sequence (bus 1240-bus 1242-bus 1244-bus 1246; "X" indicates alternative data, as described above): 0-1-2-3, 4-5-X-X, 6-7-8-9, 10-11-X-X, 12-13-14-15, 16-17-X-X, 18-19-20-21, 22-23-X-X, 24-25-26-27, 28-29-X-X, 30-31-32-33. 34-35-X-X. In an alternative implementation, the alternative data is provided by memory controller 1230. Because of switching in memory controller 1230, first memory 1210 would receive this sequence of pixel data: 0, 4, 9, X, 14, X, 19, 23, 24, 28, 33, X, as shown for first memory device 750 in FIG. 7B. In contrast, for frame 705, first memory 1210 would provide pixel data for pixels in this sequence: 0, 24, 19, X, 14, X, 9, 33, 4, 28, 23, X. "X" indicates alternative data or no data provided by first memory 1210. In an alternative implementation, memory controller 1230 provides the alternative data. Because of switching in memory controller 1230, video destination 1225 would receive pixel data for vertical pixel sets on destination buses 1250, 1252, 1254, 1256 in this sequence (bus 1250-bus 1252-bus 1254-bus 1256): 0-6-12-18, 24-30-X-X, 1-7-13-19, 25-31-X-X, 2-8-14-20, 26-32-X-X, 3-9-15-21, 27-33-X-X, 4-10-16-22, 28-34-X-X, 5-11-17-23, 29-35-X-X. Accordingly, pixel data for the 36 pixels of frame 705 would be stored in 12 parallel operations using horizontal rows and retrieved in 12 parallel operations using vertical columns. Similar patterns for storing and retrieving pixel data are used in other resolutions, such as HD resolution 1920×1080.

FIG. 13 is a table 1300 of addresses 1305 and pixel numbers 1310 for storing a 1920×1080 frame of pixel data. Pixel numbers 1310 indicate for each address 1305 in four memories (e.g., memories 1210, 1212, 1214, 1216 in FIG. 12) the pixel for which pixel data is stored at that address 1305 in each memory. FIG. 13 shows only a small number of addresses for illustration. Ellipses indicate intervening addresses or data. Some addresses are not used, indicated by "UNUSED."

512 memory locations and corresponding addresses 1305 are allocated in each memory device to each row of 1920 pixels. For example, pixel data for pixel 0 is stored at address 0 in first memory 1210 and pixel data for pixel 1 is stored at address 0 in second memory 1212. Pixel data for horizontal pixel set 1916-1917-1918-1919 (i.e., the last four pixels of the first horizontal row) is stored at address 479 in memories 1210, 1212, 1214, 1216, respectively. In the next horizontal row of pixels, pixel data for pixel set 1920-1921-1922-1923 is stored at address 512 in memories 1212, 1214, 1216, 1210, respectively (note that the order for the second row is different, as described above). Addresses 480 to 511 are not used for storing pixel data in this implementation. A similar pattern is followed for each horizontal row, so that the address for the first pixel set of each horizontal row is a multiple of 512 (i.e., 0, 512, 1024, 1536, 2048, . . . , 552448).

As described below, it is convenient for the address of the memory location for the first pixel set of each horizontal row to be a power of 2 so that addresses can be generated by merging counters. In one HD resolution, each horizontal row has 1920 pixels. Each memory stores pixel data for one-fourth of the pixels in a horizontal row and one-fourth of a row is 480 pixels. The next largest power of 2 over 480 is 512, so pixel data for each horizontal row of 1920 pixels is allocated 512 memory locations in each memory. In alternative implementations using different numbers of memory devices and different resolutions, different numbers of memory locations can be allocated for each row of pixels. For example, in an implementation using three memory devices and HD resolution 1920×1080, 1024 memory locations are allocated for each row of pixels (1920/3=640; 512<640<1024).

Before describing the overall operation of storing pixel data to memories 1210, 1212, 1214, 1216, it will be useful to describe examples of implementations of how addresses are calculated for storing pixel data. Memory controller 1230 generates addresses to store pixel data for horizontal pixel sets according to horizontal rows of pixels. In an HD resolution implementation, video source 1205 stores pixel data for pixel sets in this sequence: 0-1-2-3, 4-5-6-7, and so on. Referring to FIG. 13, memory controller 1230 generates addresses in the following sequence (one address for each pixel set): 0, 1, 2, . . . , 479, 512, 513, . . . , 991, 1024, 1025, and so on. As described above, pixel data for pixels of a horizontal pixel set are stored at the same address in respective memory devices, switching memory devices with each row.

In one implementation, memory controller 1230 includes an address counter, and increments the counter by 1 for pixel data for each pixel set output to memories 1210, 1212, 1214, 1216. For example, for pixels 0, 1, 2, and 3, the counter is 0. For pixels 4, 5, 6, and 7, the counter is 1. In an alternative implementation, the counter can be incremented by 1 for pixel data for each pixel, and the two lowest order bits of the counter are dropped before the counter value is used as an address. The value of the counter is output to memory address buses 1290, 1292, 1294, 1296.

Figure 14:
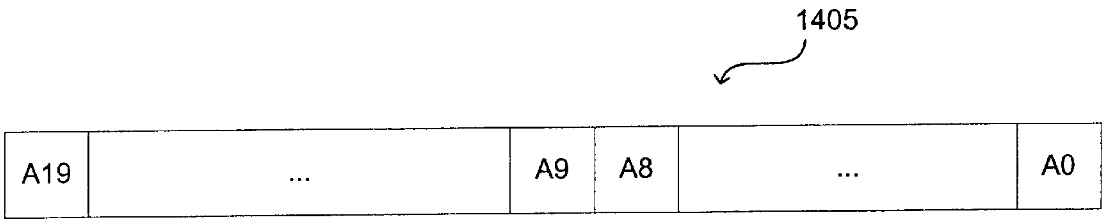
FIG. 14 is a representation of an address counter for a memory controller according to one implementation of the present invention.

FIG. 14 is a representation of an address counter 1405 for memory controller 1230. Counter 1405 has 20 bits labeled A0 to A19. As described above, memories 1210, 1212, 1214, 1216 can each be implemented as 32-bit wide 8 MB SDRAM's and so each can have $2^{21}$ (2,097,152) four-byte locations (to accommodate 32 bits per pixel). In HD resolution, one frame has 1080 horizontal rows, so there are at least 552,928 locations to address (512*1079+480=552928). Counter 1405 has 20 bits, though in an alternative implementation 21 bits can be used (21 bits would range from 0 to 2,097,151). In another implementation, the 20 bits of counter 1405 are used as the lower bits of an address and the upper bits of the address are set to a constant, such as 0. In alternative implementations, counter 1405 has different numbers of bits, such as according to the size of the memories being used. As described above, a GLV typically has 1088 pixels, creating an extra eight rows of pixels, so memories 1210, 1212, 1214, 1216 may store constant data (such as black) for these extra 8 rows of pixels when supplying pixel data to a GLV.

Because the first pixel set of each horizontal row has an address that is a multiple of 512, the first nine bits of counter 1405 (starting from the lowest order bit, A0 . . . A8; nine bits can express 0 to 511) can be viewed as a column counter indicating a pixel set in a horizontal row and the upper 11 bits (A9 . . . A19) can be viewed as a row counter indicating a horizontal row. In this view, combining the two counters produces an address. In an alternative implementation, counter 1405 can be implemented as two counters, an 11-bit row counter and an eight-bit column counter. As memory controller 1230 increments counter 1405, the tenth bit (A9) of the address, which can be viewed as the lowest order bit of the row counter, changes at the beginning of each horizontal row. Accordingly, memory controller 1230 can use this bit to control the state of switching for providing pixel data to memories 1210, 1212, 1214, 1216. In architecture 900 of FIG. 9, video source 905 can use bit A9 to control the state of first data switch 920. In another implementation, bits A9 and A10 of the address (or the two lowest order bits of the row counter) are used to select the state for storing pixel data. For example:

| A [10:9] | State |
|---|---|
| 00 | A |
| 01 | B |
| 10 | C |
| 11 | D |

Figure 15:
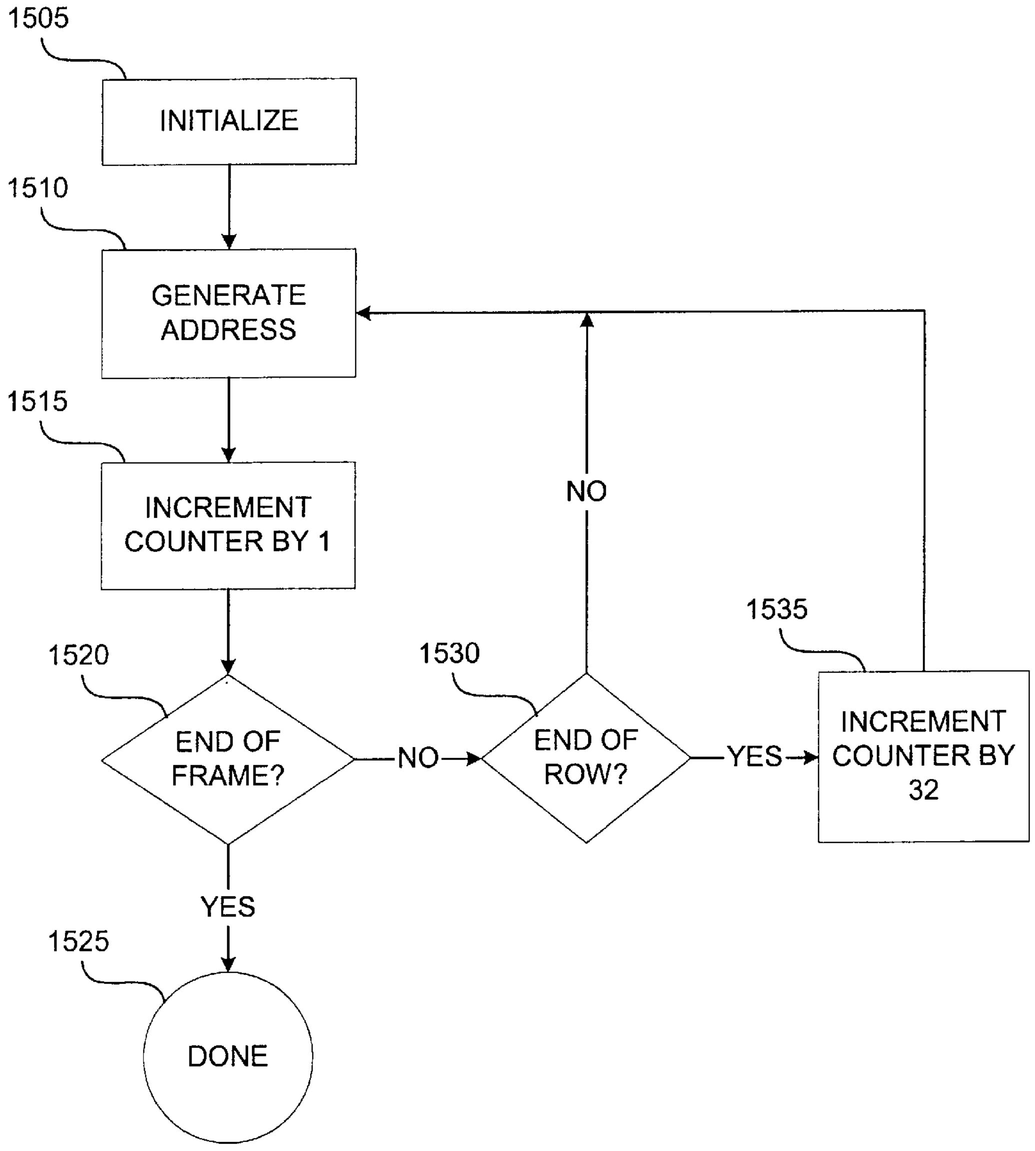
FIG. 15 is a flowchart of generating addresses for storing pixel data according to one implementation of the present invention.

FIG. 15 is a flowchart of generating addresses for storing pixel data for a frame of pixels in an HD resolution implementation using 512 locations in each memory per row of pixels. At the beginning of a frame, memory controller 1230 resets counter 1405 to 0, block 1505. Memory controller 1230 provides the value of counter 1405 as an address to memory address buses 1290, 1292, 1294, 1296, block 1510. Memory controller 1230 increments counter 1405 by 1, block 1515. Memory controller 1230 compares the value of counter 1405 to a maximum frame value to check if the last pixel set in the frame has been processed, block 1520. The maximum frame value depends on the implementation (e.g., 552,960=512*1080). If the maximum frame value has been reached, address generation for the current frame is complete, block 1525. If the maximum frame value has not been reached, memory controller 1230 compares the value of the low order 9 bits of counter 1405 to a maximum row value (e.g., 480) to check if the last pixel in a horizontal row has been processed, block 1530. If the maximum row value has been reached, memory controller 1230 increments counter 1405 by 32 (e.g., from 480 to 512, or from 992 to 1024 in the second row), block 1535, and returns to block 1510. In an alternative implementation, memory controller 1230 increments the counter by 32 based on receiving the horizontal synchronization signal. If the maximum row value has not been reached, memory controller 1230 proceeds with block 1510. When storing pixel data for a new frame, memory controller 1230 starts generating addresses again beginning with block 1505.

Figure 16:
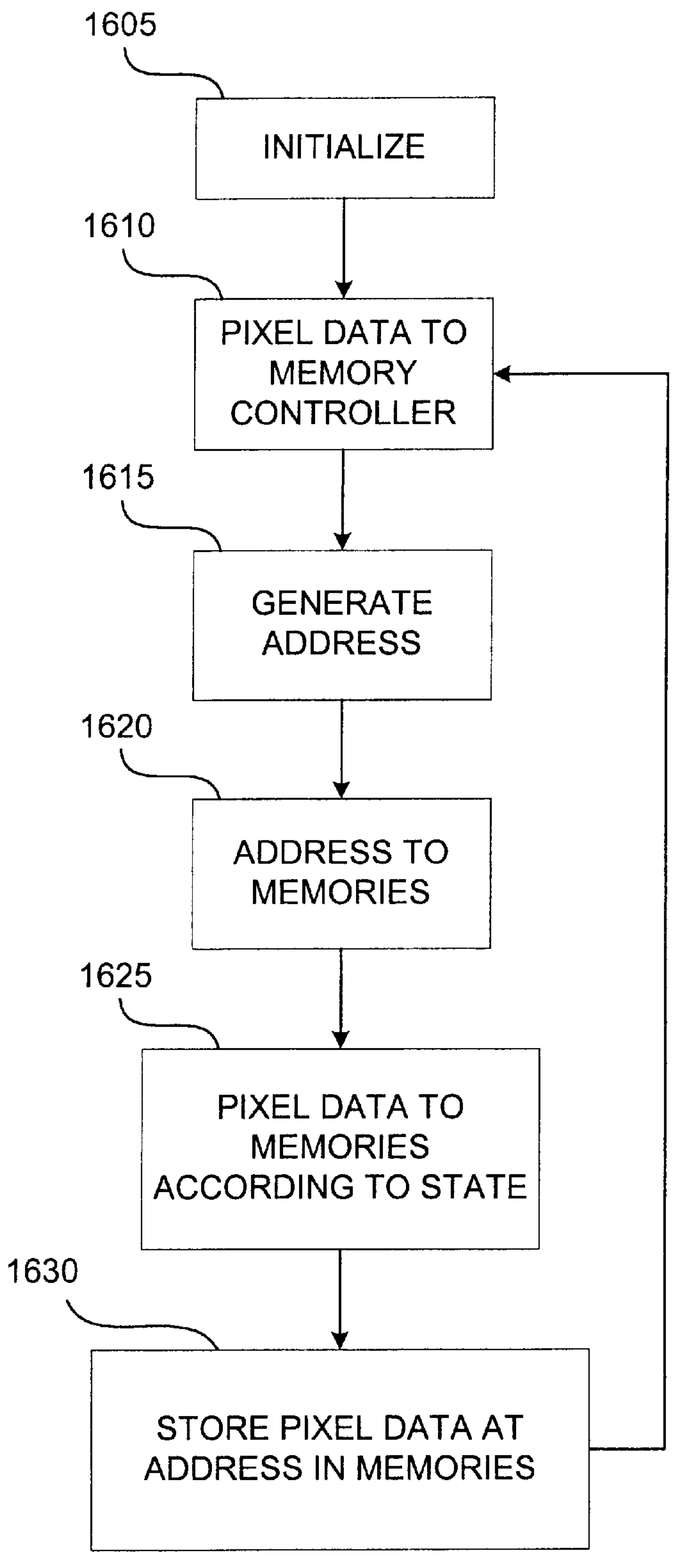
FIG. 16 is a flowchart of storing pixel data according to one implementation of the present invention.

FIG. 16 is a flowchart of storing pixel data. To store pixel data, video source 1205 provides a control signal to memory controller 1230 through control line 1260 to cause memory controller 1230 to put memories 1210, 1212, 1214, 1216 in write mode and to bring memory controller to state A for storing pixel data (recall table 1000 in FIG. 10), block 1605. Video source 805 provides pixel data for a first set of four pixels to memory controller 1230 through source buses 1240, 1242, 1244, 1246, such as pixels 0, 1, 2, and 3 in FIG. 7A, block 1610. Memory controller 1230 generates an address for storing pixel data as described above referring to FIGS. 14 and 15, block 1615. As described above, memory controller 1230 uses a counter to calculate the address, and increments the counter by 1 for each pixel set provided to memories 1210, 1212, 1214, 1216. At the beginning of each frame, video source 805 resets this counter, such as in block 1605. Memory controller 1230 provides the address to memories 1210, 1212, 1214, 1216 through memory address buses 1290, 1292, 1294, 1296, respectively, block 1620.

Memory controller 1230 provides the pixel data received from video source 1205 to memories 1210, 1212, 1214, 1216 according to the current state of memory controller 1230 for storing pixel data (recall table 1000 in FIG. 10), block 1625. As described above, memory controller 1230 changes state for storing pixel data with each row of pixels.

Memories 1210, 1212, 1214, 1216 store the pixel data on memory data buses 1280, 1282, 1284, 1286, respectively, at the address supplied by memory controller 1230 on memory address buses 1290, 1292, 1294, 1296, block 1630. Pixel data for four pixels has been stored in parallel in four respective memories using the same address. Referring to FIG. 13, pixel data for pixels 0, 1, 2, and 3 would be stored at address 0 in each of memories 1210, 1212, 1214, 1216 at the same time. To store pixel data for the next four pixels, video source 1205 and memory controller 1230 return to block 1610, or to block 1605 to restore the state of architecture 1200 for storage.

Before describing the overall operation of retrieving pixel data from memories 1210, 1212, 1214, 1216, it will be useful to describe examples of implementations of how addresses are calculated for retrieving pixel data. Video destination 1225 retrieves pixel data corresponding to vertical columns of pixels, but video source 1205 has stored pixel data in memories 1210, 1212, 1214, 1216 using horizontal rows of pixels. Accordingly, pixel data for vertically adjacent pixels do not have adjacent memory addresses. Pixel data for the vertical pixel sets retrieved by video destination 1225 do not have the same address, in contrast with the horizontal pixel sets in storing pixels. For example, referring to FIGS. 7A and 7B, pixels 0, 6, 12, and 18 are vertically adjacent pixels in the same vertical column and would be retrieved as a set by video destination 1225. However, pixel data for pixels 0, 6, 12, and 18 are not at the same or neighboring addresses. Pixel data for pixel 0 is stored at address 0 in first memory device 750. Pixel data for pixel 6 is stored at address 2 in second memory device 760. Pixel data for pixel 12 is stored at address 4 in third memory device 770. Pixel data for pixel 18 is stored at address 6 in fourth memory device 780. The addresses are offset from one another by the number of memory locations allocated for each of pixels, e.g., 2 in FIGS. 7A and 7B.

In an HD resolution implementation, video destination 1225 retrieves pixel data for vertical pixel sets in this sequence: 0-1920-3840-5760, 7680-9600-11520-13440, . . . , 1-1921-3841-5761, and so on. Memory controller 1230 generates four addresses for each vertical pixel set. One address is supplied to each of memories 1210, 1212, 1214, 1216. Referring to FIG. 13, memory controller 1230 generates addresses in the following sequence: 0-512-1024-1536, 2048-2560-3072-3584, . . . , 0-512-1024-1536, 2048-2560-3072-3584, . . . , 0-512-1024-1536, 2048-2560-3072-3584, . . . , 0-512-1024-1536, 2048-2560-3072-3584, . . . , 1-513-1025-1537, 2049-2561-3073-3585, and so on. The same sequence of addresses can be used for four columns of pixels, however, which memory receives which address changes with each column. In the first column, first memory 1210 receives the first address of the four addresses, and in the second column, first memory 1210 receives the fourth address. For example, for the first vertical pixel set in the first column, first memory 1210 receives address 0 (pixel 0), second memory 1212 receives address 512 (pixel 1920), third memory 1214 receives address 1024 (pixel 3840), and fourth memory 1216 receives address 1536 (pixel 5760). For the first vertical pixel set in the second column, first memory 1210 receives address 1536 (pixel 5761), second memory 1212 receives address 0 (pixel 1), third memory 1214 receives address 512 (pixel 1921), and fourth memory 1216 receives address 1024 (pixel 3841).

Figure 17:
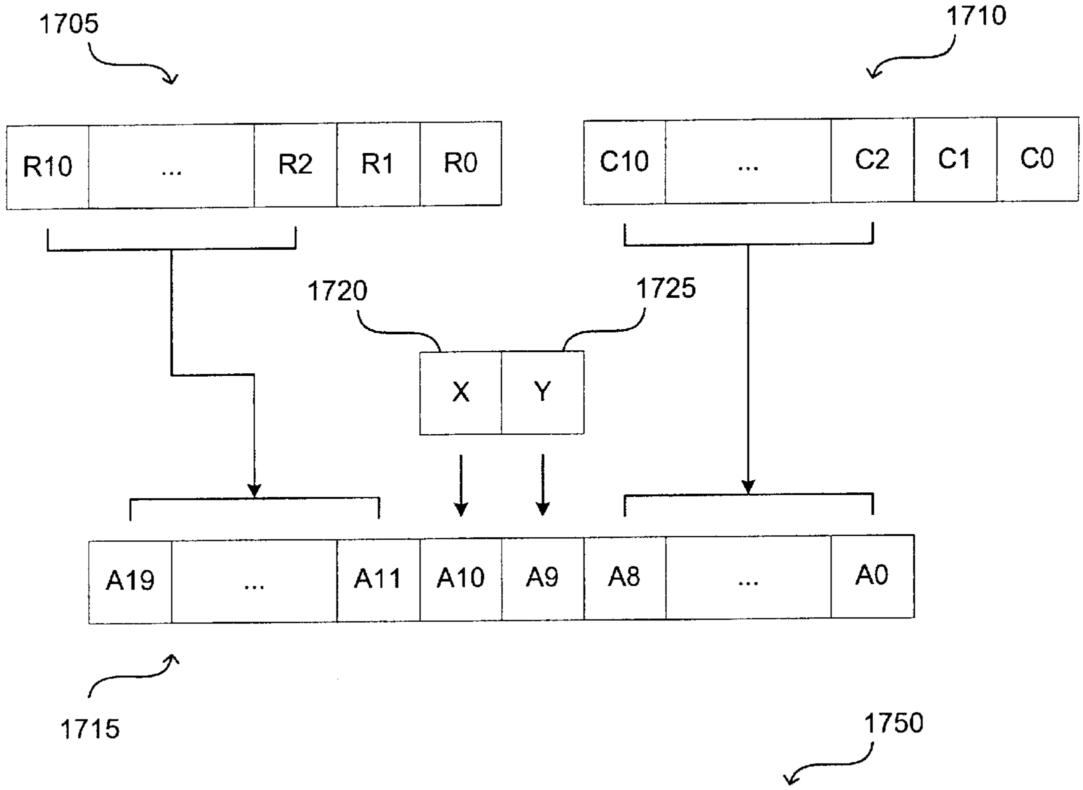
FIG. 17 is a representation of generating destination addresses according to one implementation of the present invention.

FIG. 17 is a representation of generating destination addresses. Memory controller 1230 includes two address counters: a row counter 1705, and a column counter 1710. Row counter 1705 indicates horizontal rows and column counter 1710 indicates vertical columns of pixels. Row counter 1705 has 11 bits, ranging from 0 to 2047, accommodating all 1080 horizontal rows in the frame. Column counter 1710 has 11 bits, ranging from 0 to 2047, to accommodate all 1920 vertical columns in the frame. In combination, the counters can indicate a pixel in the frame. As shown in FIG. 17, memory controller 1230 uses some of the bits from row counter 1705, some of the bits from column counter 1710, and two bits based on the state for retrieving pixel data to form four 20-bit destination addresses 1715. In an alternative implementation, each destination address 1715 is a 21-bit address and row counter 1705 has 12 bits. Memory controller 1230 generates the four destination addresses 1715 and passes each to a respective memory 1210, 1212, 1214, 1216.

Memory controller 1230 uses bits C2 through C10 from column counter 1710 for destination address bits A0 through A8 and bits R2 through R10 from row counter 1705 for destination address bits A11 through A19. Memory controller 1230 uses a state bit X 1720 and a state bit Y 1725 for destination address bits A10 and A9, respectively. Memory controller 1230 generates state bits X and Y 1720, 1725 for each of the four destination addresses 1715 based on the current state for retrieving pixel data. Accordingly, each of the four destination addresses 1715 have the same values for address bits A0–A8 and A11–A19. Address bits A9 and A10 are different for each destination address 1715.

Table 1750 shows the values of state bits X and Y 1720, 1725 for each state for retrieving pixel data for each memory's destination address. For example, in state A for retrieving pixel data, for the destination address 1715 to be supplied to first memory 1210, memory controller 1230 sets state bit X 1720 to 0 and state bit Y 1725 to 0. For the destination address 1715 to be supplied to second memory 1212 in state A, memory controller 1230 sets state bit X 1720 to 0 and state bit Y 1725 to 1. For the destination address 1715 to be supplied to third memory 1214 in state A, memory controller 1230 sets state bit X 1720 to 1 and state bit Y 1725 to 0. For the destination address 1715 to be supplied to fourth memory 1216 in state A, memory controller 1230 sets state bit X 1720 to 1 and state bit Y 1725 to 1. In state B, for the destination address 1715 to be supplied to first memory 1210, memory controller 1230 sets state bit X 1720 to 1 and state bit Y 1725 to 1, and so on.

Memory controller 1230 can also use the value of column counter 1710 to control the state of switching for providing pixel data to video destination through destination buses 1250, 1252, 1254, 1256, such as by using the lowest one or two bits of column counter 1710 (e.g., similar to using bits A9 and A10 in storing pixel data as described above). In one implementation, memory controller 1230 uses a change in bit C0 to indicate a new column. In another implementation, memory controller 1230 uses bits C0 and C1 to indicate the state for retrieving pixel data. For example:

| C [1:0] | State |
|---|---|
| 00 | A |
| 01 | B |
| 10 | C |
| 11 | D |

In an alternative implementation, memory controller 1230 uses row counter 1705 and column counter 1710 as indexes into a look-up-table to generate four destination addresses. In this case, memory controller 1230 uses the state for retrieving pixel data to control which destination address to provide to which memory 1210, 1212, 1214, 1216.

Figure 18:
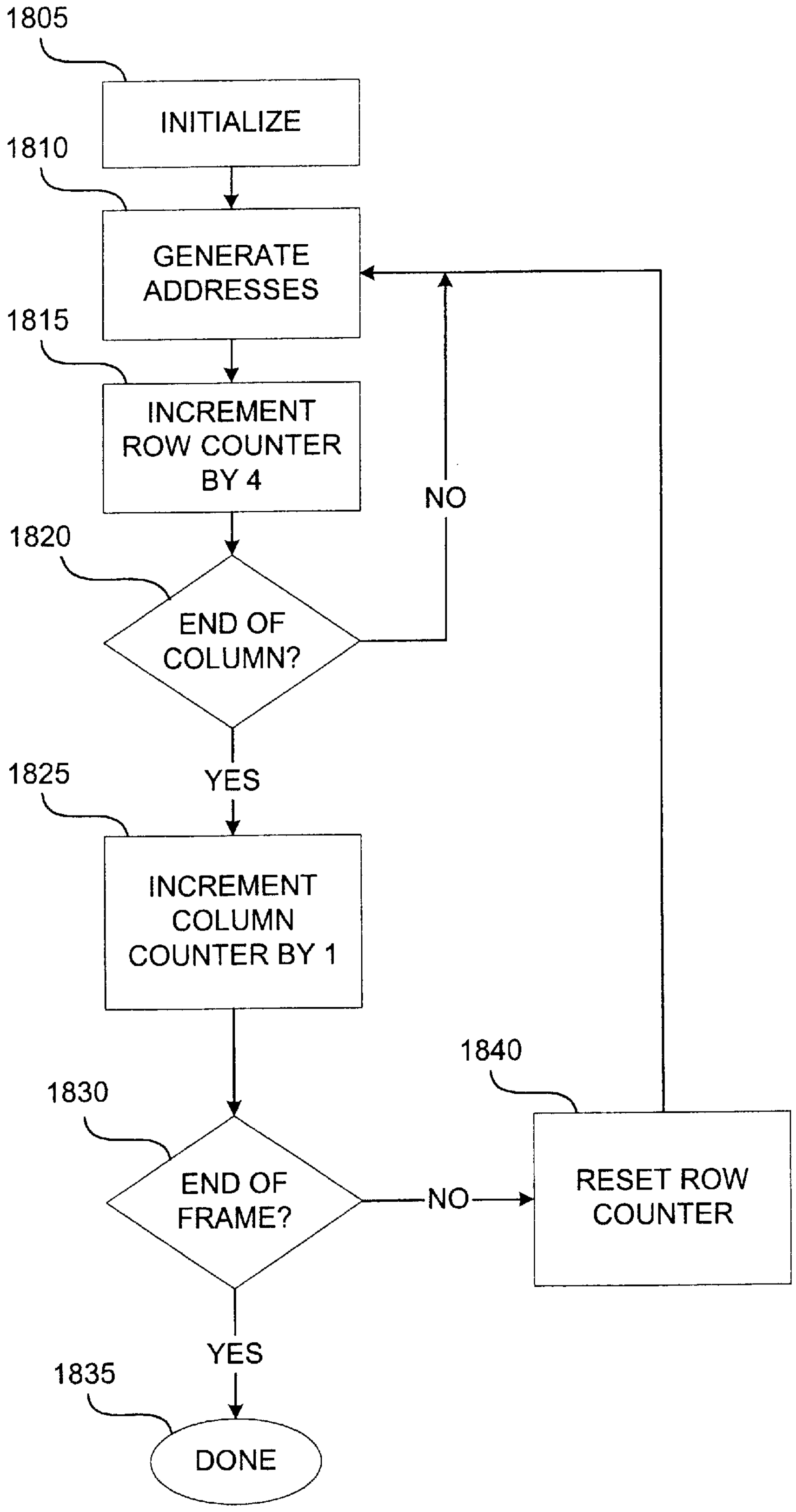
FIG. 18 is a flowchart of generating addresses for retrieving pixel data according to one implementation of the present invention.

FIG. 18 is a flowchart of generating addresses for retrieving pixel data for a frame of pixels in an HD resolution implementation using 512 locations in each memory per row of pixels. At the beginning of a frame, memory controller 1230 resets row counter 1705 to 0 and column counter 1710 to 0, block 1805. Memory controller 1230 generates four destination addresses 1715, as described above, block 1810. Memory controller 1230 provides each of the four destination addresses 1715 to the corresponding memory 1210, 1212, 1214, 1216. As described above referring to table 1750 in FIG. 17, each destination address 1715 differs in two bits (A9 and A10) according to the state for retrieving pixel data and according to which memory 1210, 1212, 1214, 1216 is to receive the destination address 1715. Memory controller 1230 increments row counter 1705 by 4, block 1815. Memory controller 1230 compares the value of row counter 1705 to a maximum row value (e.g., 1080) to check if the end of the vertical column has been reached, block 1820. If row counter 1705 is less than the maximum row value, memory controller 1230 proceeds to block 1810. If row counter 1705 is greater than or equal to the maximum row value, memory controller 1230 increments column counter 1710 by 1, block 1825. Memory controller 1230 compares the value of column counter 1710 to a maximum column value (e.g., 1920) to check if the end of the frame has been reached, block 1830. If the maximum column value has been reached, address generation for the current frame is complete, block 1835. If the maximum column value has not been reached, memory controller 1230 resets row counter 1705, block 1840, and proceeds to block 1810. When retrieving pixel data for a new frame, memory controller 1230 starts generating addresses again beginning with block 1805.

Figure 19:
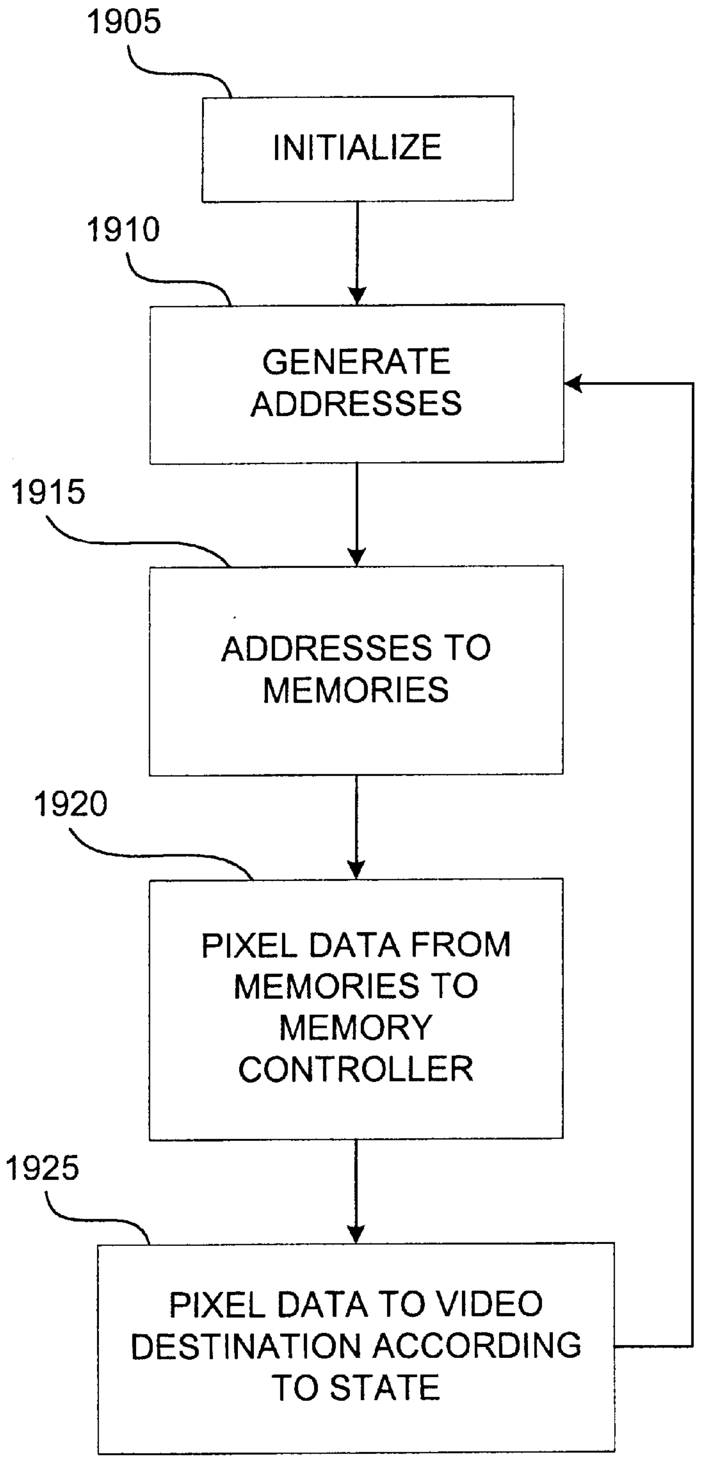
FIG. 19 is a flowchart of retrieving pixel data according to one implementation of the present invention.

FIG. 19 is a flowchart of retrieving pixel data. To retrieve pixel data, video destination 1225 provides a control signal to memory controller 1230 through control line 1270 to cause memory controller 1230 to put memories 1210, 1212, 1214, 1216 in read mode and to bring memory controller to state A for retrieving pixel data (recall table 1100 in FIG. 11), block 1905. Memory controller 1230 generates four destination addresses 1715, as described above, block 1910. Memory controller 1230 provides each of the destination addresses 1715 to the corresponding memory 1210, 1212, 1214, 1216 through memory address buses 1290, 1292, 1294, 1296, as described above, block 1915. Memories 1210, 1212, 1214, 1216 provide pixel data stored at the received addresses to memory controller 1230 through memory data buses 1280, 1282, 1284, 1286, block 1920.

Memory controller 1230 provides the pixel data received from memories 1210, 1212, 1214, 1216 to video destination 1225 according to the current state of memory controller 1230 for retrieving pixel data (recall table 1100 in FIG. 11), block 1925. As described above, memory controller 1230 changes state for retrieving pixel data with each column of pixels. In one implementation, memory controller 1230 uses the value of column counter 1710 to control the state for retrieving pixel data (e.g., bits C0 and C1). Pixel data for four pixels has been retrieved in parallel from four memories using four different addresses. Referring to FIG. 13, pixel data for pixels 0, 1920, 3840, and 5760 would be retrieved from addresses 0, 512, 1024, and 1576, respectively, in each of memories 1210, 1212, 1214, 1216 at the same time. To retrieve pixel data for the next four pixels, video destination 1225 and memory controller 1230 return to block 1910, or to block 1905 to restore the state of architecture 1200 for storage.

In alternative implementations, as described above, a different number of memory devices can be used, such as three or five. Using a number of memory devices that divides evenly into the resolution of the frame (or the orders of the data, more generally) can avoid allocating memory locations that are not used. Increasing the number of memory devices can improve speed and can reduce the minimum desirable size for each memory device.

In another alternative implementation, similar to that described in U.S. application Ser. No. 09/907,852 (filed Jul. 17, 2001), which is incorporated herein by reference, rather than allocating memory locations to be a power of 2 for each row of pixels, a more closely sequential allocation of memory locations can be used. In one implementation using four memory devices and an HD resolution of 1920×1080, 480 memory locations are allocated for each row of pixels, rather than 512 as described above. This allocation conserves memory use. The sequences of pixels for which pixel data is to be stored or retrieved does not change, but the addresses are different. A row counter and a column counter can be used to provide an index to a look-up-table of addresses for storing and retrieving.

2. Checkerboard Frame Buffer Using Memory Bank Alternation

Increasing from two memory devices to four memory devices in a frame buffer can provide an improvement in memory bandwidth. Similarly, increasing from the four memory devices of architecture 1200 in FIG. 12 to eight memory devices can provide a further increase in bandwidth by providing simultaneous storing and retrieving of pixel data.

Figure 20:
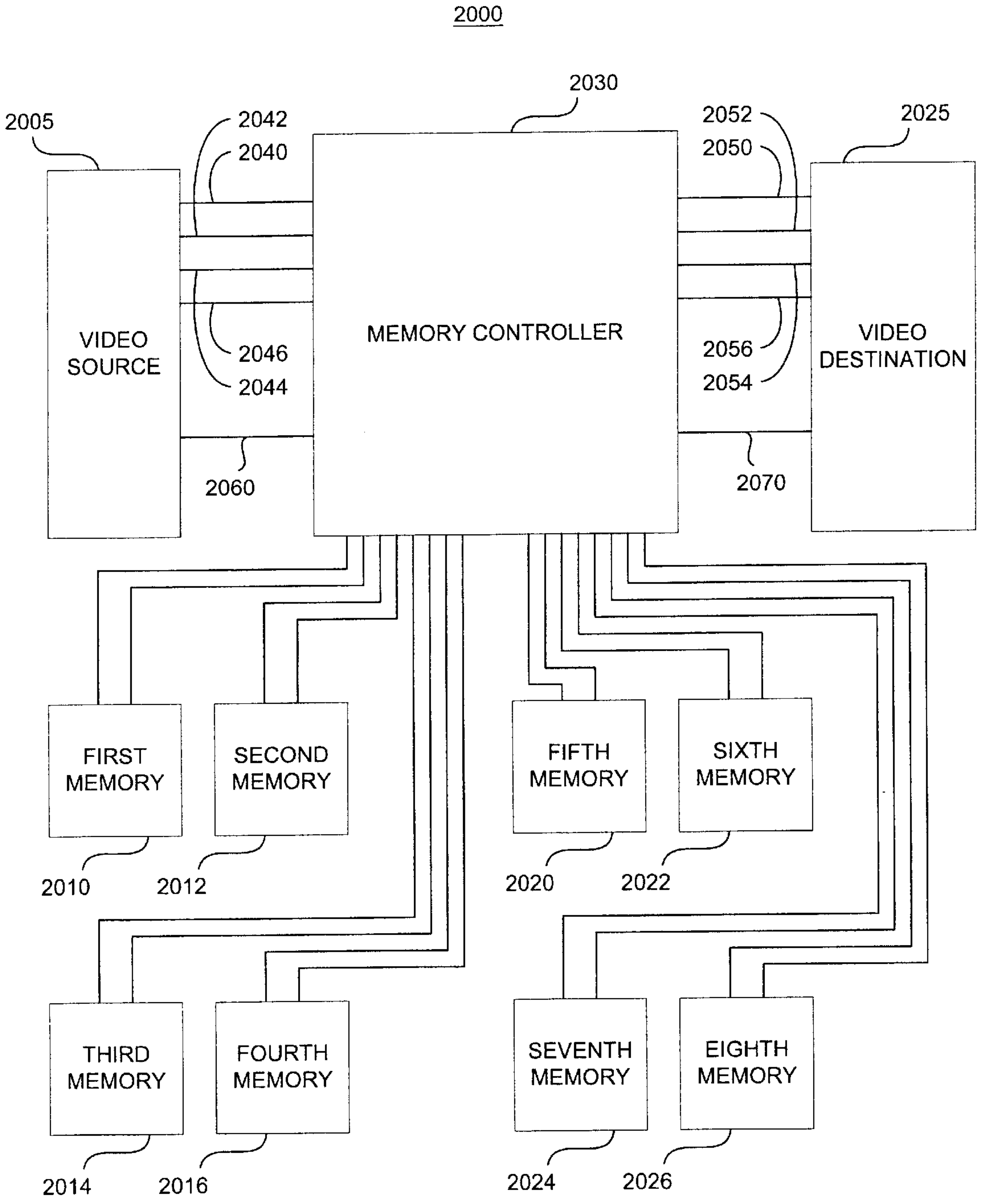
FIG. 20 is a block diagram of a switching dual pixel frame buffer architecture having eight memory devices according to one implementation of the present invention.

FIG. 20 is a block diagram of a switching dual pixel frame buffer architecture 2000 having eight memory devices: first memory 2010, second memory 2012, third memory 2014, fourth memory 2016, fifth memory 2020, sixth memory 2022, seventh memory 2024, and eighth memory 2026. The memory devices are used in two alternating banks for storing and retrieving pixel data a frame at a time. For example, a first frame of pixel data is stored, four pixels at a time, in memories 2010, 2012, 2014, 2016, such as described above referring to FIG. 16. A second frame of pixel data is then stored in memories 2020, 2022, 2024, 2026. While the second frame is being stored, the first frame of pixel data is retrieved from memories 2010, 2012, 2014, 2016, four pixels at a time, such as described above referring to FIG. 19. Accordingly, pixel data for the first frame is retrieved at the same time pixel data for the second frame is stored (i.e., during the same clock cycle). During every clock cycle, pixel data for one frame is stored and pixel data previously stored is retrieved. For the next frames, the memory banks are switched. The third frame of pixel data is stored in memories 2010, 2012, 2014, 2016, while the second frame pixel data is retrieved from memories 2020, 2022, 2024, 2026. This alternation between memory banks continues as long as frames are supplied to video source 2005.

Architecture 2000 is similar to architecture 1200 in FIG. 12. In architecture 2000, memory controller 2030 controls address generation and routing pixel data to and from memories 2010, 2012, 2014, 2016, 2020, 2022, 2024, 2026 in parallel. Each of memories 2010, 2012, 2014, 2016, 2020, 2022, 2024, 2026 is connected to memory controller 2030 by a respective memory data bus and a respective memory address bus. Memory controller 2030 has two states for controlling bank alternation: (A) providing pixel data from video source 2005 to memories 2010, 2012, 2014, 2016, and providing pixel data from memories 2020, 2022, 2024, 2026 to video destination 2025; and (B) providing pixel data from video source 2005 to memories 2020, 2022, 2024, 2026, and providing pixel data from memories 2010, 2012, 2014, 2016 to video destination 2025. Accordingly, in state A, pixel data is stored in memories 2010, 2012, 2014, 2016, and retrieved from memories 2020, 2022, 2024, 2026. Conversely, in state B, pixel data is retrieved from memories 2010, 2012, 2014, 2016, and stored in memories 2020, 2022, 2024, 2026. Memory controller 2030 receives a control signal to switch between states, such as from video source 2005 on control line 2060. Video source 2005 toggles the control signal after completing storing pixel data for a frame. In one implementation, memory controller 2030 is connected to a flip-flop that is triggered by a vertical synchronization signal supplied by video source 2005. In addition, while clock lines are not shown in FIG. 20, architecture 2000 operates based on clock cycles so that pixel data can be processed for up to eight pixels per clock cycle in support of the desired pixel rate.

Figure 21:
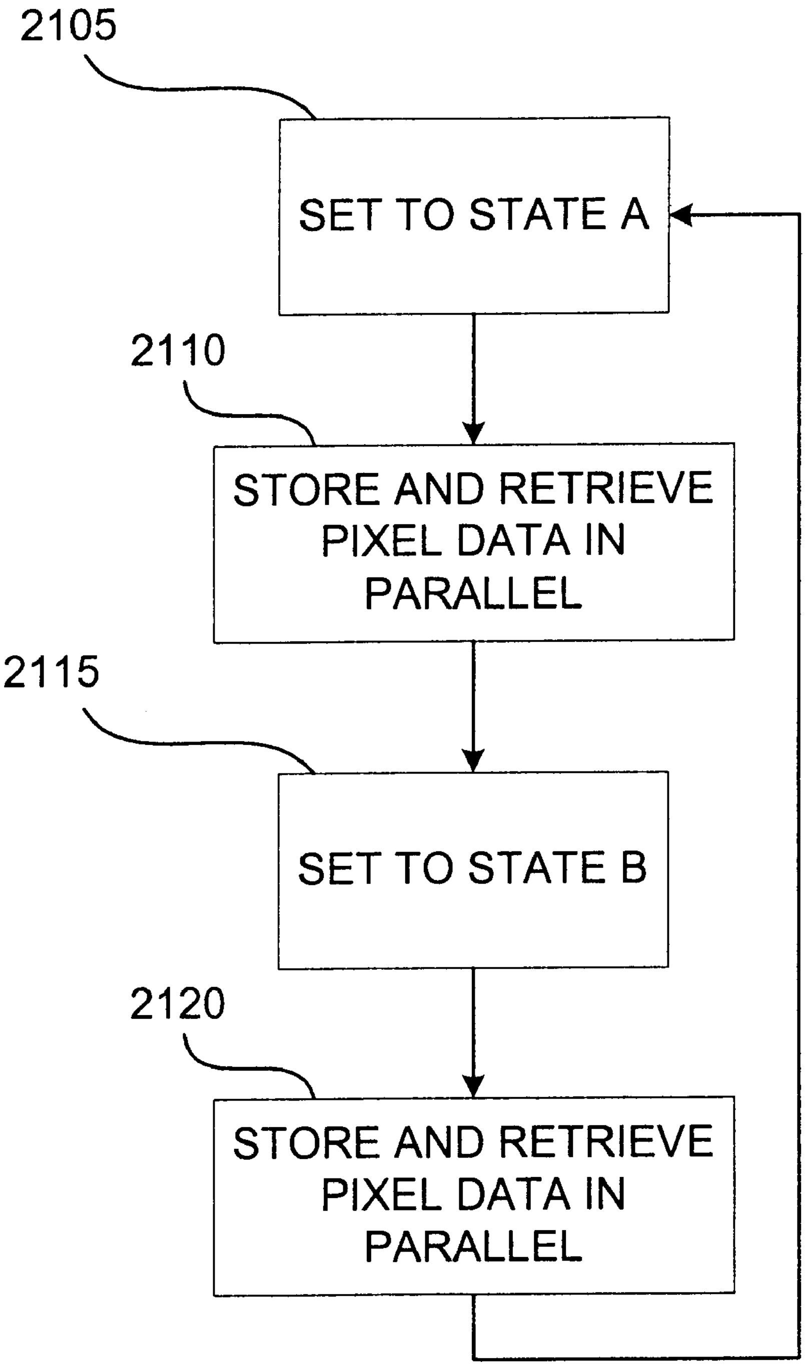
FIG. 21 is a flowchart of storing and retrieving pixel data in parallel using bank alternation according to one implementation of the present invention.

FIG. 21 is a flowchart of storing and retrieving pixel data in parallel using bank alternation, such as in architecture 2000 of FIG. 20. When a first frame of pixel data becomes available to video source 2005, video source 2005 sets memory controller 2030 to bank alternation state A (pixel data to be stored to memories 2010, 2012, 2014, 2016, pixel data to be retrieved from memories 2020, 2022, 2024, 2026), block 2105. Memory controller 2030 stores the first frame of pixel data, four pixels at a time, in memories 2010, 2012, 2014, 2016, as described above, and memory controller 2030 retrieves pixel data from memories 2020, 2022, 2024, 2026, as described above, block 2110. Initially, pixel data has not been stored in memories 2020, 2022, 2024, 2026, and so pixel data retrieved during the first loop may not produce a desirable image. After a frame of pixel data has been stored, video source 2005 sets memory controller 2030 to bank alternation state B (pixel data to be retrieved from memories 2010, 2012, 2014, 2016, pixel data to be stored to memories 2020, 2022, 2024, 2026), block 2115. Memory controller 2030 stores a frame of pixel data and retrieves pixel data for another frame according to the bank alternation state of memory controller 2030, as described above, block 2120. After a frame of pixel data has been stored, video source 2005 returns to block 2105 and sets memory controller 2030 to bank alternation state A. When a new frame is not available to video source 2005, storing and retrieving pixels from architecture 2000 is complete. When a new frame later becomes available, video source 2005 begins at block 2105 again.

3. Checkerboard Frame Buffer Using Four Memory Devices and Memory Sections

In another implementation, the memory address space is divided into two sections. This division applies to all four memory devices. As described above referring to double-buffering, one section of each memory is used for storing pixel data and the other section for retrieving pixel data. The sections switch roles with each frame. The operation of architecture 1200 of FIG. 12 modified to use memory sections is described below.

Memories 1210, 1212, 1214, 1216 each store pixel data for complementary halves of two frames at a time. Memories 1210, 1212, 1214, 1216 are divided in half. For example, where memories 1210, 1212, 1214, 1216 are 32-bit wide 8 MB SDRAM's, a first section of addresses (0 through 1,048,575) is for one frame and a second section of addresses (1,048,576 through 2,097,151) is for another frame. As described above, in HD resolution, one-fourth of one frame has 518,400 pixels and so a 32-bit wide 8 MB SDRAM is sufficiently large for one-fourth of each of two frames.

While one frame is being stored in one section, another frame is being retrieved from the other section, such as in alternating series of read and write operations. After processing these frames has completed, pixel data for a new frame is read into the section storing the frame just read out, and pixel data for the frame just stored is read out. In this way, the sections alternate between reading and writing. To generate addresses for storing pixels, memory controller 1230 alternates between initializing the counter to 0 and to the middle of the available address space (e.g., 1,048,576) with each frame to alternate between the two sections of memory. Similarly, memory controller 1230 alternates between resetting its counter to 0 and the middle of the available address space with each frame to be retrieved.

In addition, pixel data can be stored and retrieved in alternation for blocks of pixels smaller than an entire frame. For example, in one implementation, memory controller 1230 includes two FIFO buffers: a source FIFO buffer for pixel data to be stored, and a destination FIFO buffer for pixel data retrieved. As memory controller 1230 receives pixel data from video source 1205, memory controller 1230 fills its source FIFO buffer. At regular intervals, such as when the FIFO buffer is full or after pixel data for a number of pixels has been placed in the FIFO buffer, memory controller 1230 stores pixel data for a block of pixels from its FIFO buffer, such as the first 32 pixels in the FIFO buffer, generating appropriate addresses for a series of write operations. After this block has been stored, memory controller 1230 retrieves pixel data for a block of pixels, such as 32 pixels, generating appropriate addresses for a series of read operations from memories 1210, 1212, 1214, 1216, and stores the pixel data in its destination FIFO buffer. At regular intervals, such as when the FIFO buffer is full or after pixel data for a number of pixels has been placed in the FIFO buffer, memory controller 1230 provides pixel data from the destination FIFO buffer to video destination 1225. After retrieving the block of pixel data, memory controller 1230 stores the next block of pixel data, and so on. Memory controller 1230 preserves the counter values for address generation between blocks to accommodate this block-based processing.

In another implementation, video source 1205 and video destination 1225 control use of memory sections. Video source 1205 and video destination 1225 each include a FIFO buffer. As video source 1205 receives pixel data, video source 1205 fills its FIFO buffer. At regular intervals, such as when the FIFO buffer is full or after pixel data for a number of pixels has been placed in the FIFO buffer, video source 1205 causes pixel data for a block of pixels from its FIFO buffer, such as the first 32 pixels in the FIFO buffer, to be stored and memory controller 1230 generates the appropriate addresses for a series of write operations. After this block has been stored video source 1205 passes control to video destination 1225. Video destination 1225 causes memory controller 1230 to generate addresses, retrieves pixel data for a block of pixels, such as 32 pixels, in a series of read operations from memories 1210, 1212, 1214, 1216, and stores the pixel data in its own FIFO buffer. Video destination 1225 then passes control back to video source 1205, and so on. Memory controller 1230 preserves the counter values for address generation between blocks to accommodate this block-based processing.

Figure 22:
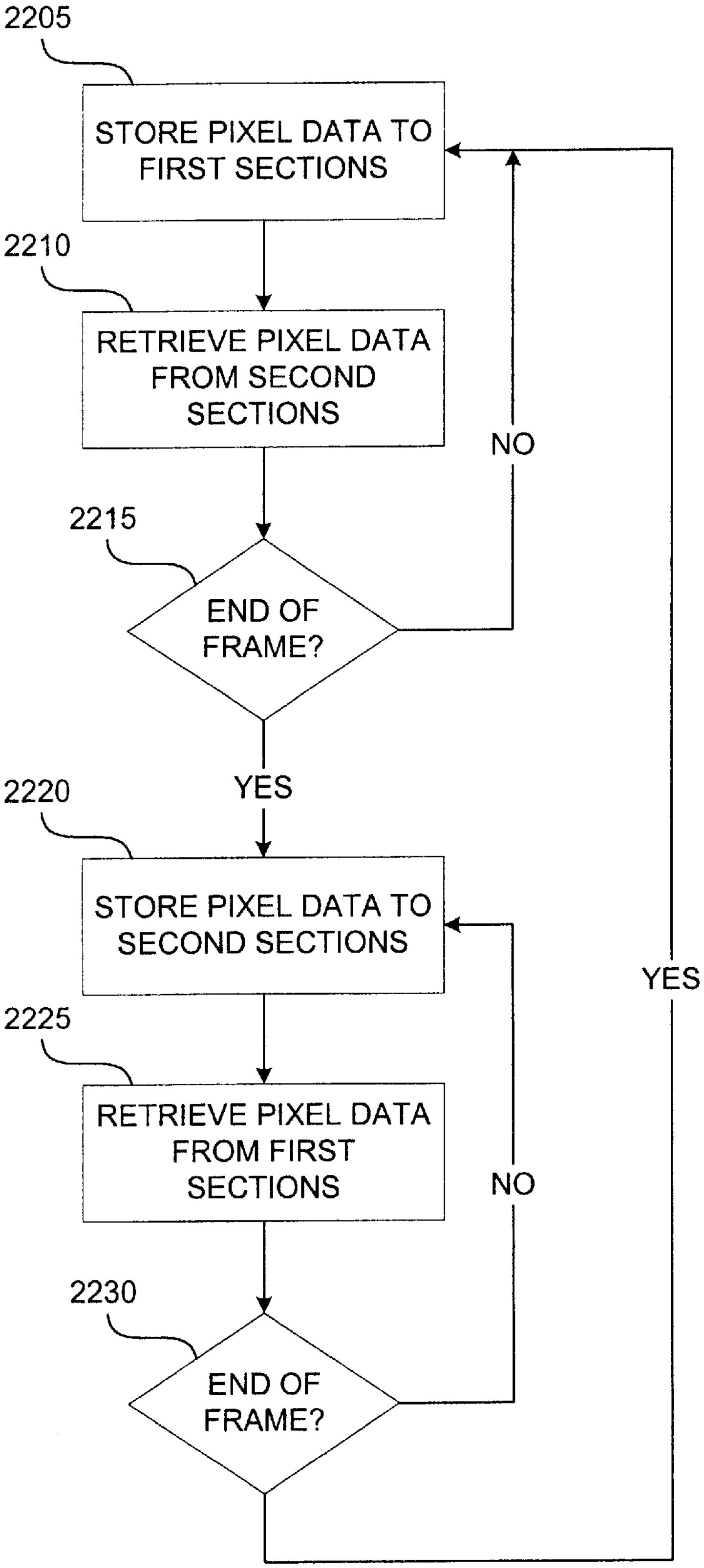
FIG. 22 is a flowchart of reading and writing blocks of pixels using memory sections according to one implementation of the present invention.

FIG. 22 is a flowchart of reading and writing blocks of pixels using memory sections. When memory controller 1230 has received pixel data for a block of pixels from a first frame, such as 32 pixels, memory controller 1230 stores the pixel data in the first sections (e.g., starting from address 0) of memories 1210, 1212, 1214, 1216 in a series of write operations, block 2205. Memory controller 1230 retrieves pixel data for a block of pixels from a previous frame, such as 32 pixels, from the second sections (e.g., starting from the middle of the memory address space, such as 1,048,576) of memories 1210, 1212, 1214, 1216, block 2210. Initially, while the very first frame is being stored to the first sections, the second sections will have undefined data and so pixel data retrieved from the second sections during this first iteration will most likely not produce a desirable image, but this situation will only last while the first frame is being stored. Memory controller 1230 checks whether the end of the frame being stored has been reached, such as based on a vertical synchronization signal, block 2215. If the end of the frame has not been reached, memory controller 1230 returns to block 2205 and stores pixel data for the next block of pixels in the first sections of memories 1210, 1212, 1214, 1216. If the end of the frame has been reached, memory controller 1230 stores pixel data for the next block of pixels from the next frame in the second sections of memories 1210, 1212, 1214, 1216, block 2220. Memory controller 1230 retrieves pixel data for a block of pixels from the first sections of memories 1210, 1212, 1214, 1216, block 2225. Memory controller 1230 checks whether the end of the frame being stored has been reached, block 2230. If the end of the frame has not been reached, memory controller 1230 returns to block 2220 and stores pixel data for the next block of pixels in the second sections of memories 1210, 1212, 1214, 1216. If the end of the frame has been reached, memory controller 1230 returns to block 2205 and stores pixel data for the first block of pixels from the next frame in the first sections of memories 1210, 1212, 1214, 1216. This alternation continues until memory controller 1230 does not receive pixel data from video source 1205.

Various illustrative implementations of the present invention have been described. The above description focuses on HD resolution (1920×1080) video data displayed using a GLV system, but the methods and apparatus can be applied to different resolutions and different devices, as well as data other than video data. Similarly, the pixel data for a pixel is described above as being 32 bits, but different depths are also possible with modification to the size of the addressed memory locations. The present invention can be implemented in electronic circuitry, computer hardware, software, or in combinations of them. For example, a checkerboard buffer can be implemented in various ways, such as with an FPGA, a hardwired design, a microprocessor architecture, or a combination. However, one of ordinary skill in the art will see that additional implementations are also possible and within the scope of the present invention. Accordingly, the present invention is not limited to only those implementations described above.

What is claimed is:

1. A method of storing pixel data in a checkerboard buffer, comprising:

storing pixel data for a first pixel at a first memory address in a first memory device, where the first pixel is the first pixel in a first horizontal row of pixels in a frame;

storing pixel data for a second pixel at the first memory address in a second memory device, where the second pixel is the second pixel in the first horizontal row of pixels in the frame;

storing pixel data for a third pixel at the first memory address in a third memory device, where the third pixel is the third pixel in the first horizontal row of pixels in the frame;

storing pixel data for a fourth pixel at a second memory address in the second memory device, where the fourth pixel is the first pixel in a second horizontal row of pixels in the frame;

storing pixel data for a fifth pixel at the second memory address in the third memory device, where the fifth pixel is the second pixel in the second horizontal row of pixels in the frame;

storing pixel data for a sixth pixel at the second memory address in the first memory device, where the sixth pixel is the third pixel in the second horizontal row of pixels in the frame;

storing pixel data for a seventh pixel at a third memory address in the third memory device, where the seventh pixel is the first pixel in a third horizontal row of pixels in the frame;

storing pixel data for an eighth pixel at the third memory address in the first memory device, where the eighth pixel is the second pixel in the third horizontal row of pixels in the frame; and storing pixel data for a ninth pixel at the third memory address in the second memory device, where the ninth pixel is the third pixel in the third horizontal row of pixels in the frame;

where the first, second, and third pixels are vertically adjacent to the fourth fifth, and sixth pixels, respectively, and the fourth, fifth, and sixth pixels are vertically adjacent to the seventh, eighth, and ninth pixels, respectively.

2. The method of claim 1 wherein each storing step occurs during a respective clock cycle.

3. The method of claim 1 wherein:

the storing the pixel data for the first, second and third pixels steps occur during a first clock cycle;

the storing the pixel data for the fourth, fifth and sixth pixels steps occur during a second clock cycle; and the storing the pixel data for the seventh, eighth and ninth pixels steps occur during a third clock cycle.

4. The method of claim 1 wherein:

the storing the pixel data for the first, second and third pixels steps occur in parallel;

the storing the pixel data for the fourth, fifth and sixth pixels steps occur in parallel; and the storing the pixel data for the seventh, eighth and ninth pixels steps occur in parallel.

5. The method of claim 1 further comprising:

generating the first memory address, the second memory address and the third memory address.

6. The method of claim 5 wherein the generating the memory addresses step comprises:

generating the memory addresses using a row counter and a column counter.

7. The method of claim 5 further comprising:

switching the pixel data for a respective pixel to a respective memory device based on a value of the column counter.

8. The method of claim 1 wherein the memory address in a given memory device for pixels in a given horizontal row of the frame is the same.

9. The method of claim 1 further comprising:

switching which memory device to store pixel data for each pixel with each horizontal row of the frame.

10. The method of claim 1 further comprising:

retrieving the pixel data for the first pixel from the first memory address in the first memory device;

retrieving the pixel data for the fourth pixel from the second memory address in the second memory device;

retrieving the pixel data for the seventh pixel from the third memory address in the third memory device;

wherein the first, fourth and seventh pixels are in a first vertical column of pixels in the frame;

retrieving the pixel data for the second pixel from the first memory address in the second memory device;

retrieving the pixel data for the fifth pixel from the second memory address in the third memory device;

retrieving the pixel data for the eighth pixel from the third memory address in the first memory device;

wherein the second, fifth and eighth pixels are in a second vertical column of pixels in the frame;

retrieving the pixel data for the third pixel from the first memory address in the third memory device;

retrieving the pixel data for the sixth pixel from the second memory address in the first memory device; and retrieving the pixel data for the ninth pixel from the third memory address in the second memory device;

wherein the third, sixth and ninth pixels are in a third vertical column of pixels in the frame.

11. The method of claim 10 wherein:

the retrieving the pixel data for the first, fourth and seventh pixels steps occur during a first clock cycle;

the retrieving the pixel data for the second, fifth and eighth pixels steps occur during a second clock cycle; and the retrieving the pixel data for the third, sixth and ninth pixels steps occur during a third clock cycle.

12. The method of claim 10 wherein:

the retrieving the pixel data for the first, fourth and seventh pixels steps occur in parallel;

the retrieving the pixel data for the second, fifth and eighth pixels steps occur in parallel; and the retrieving the pixel data for the third, sixth and ninth pixels steps occur in parallel.

13. The method of claim 10 wherein each retrieving step occurs during a respective clock cycle.

14. The method of claim 10 further comprising:

generating the first memory address, the second memory address and the third memory address using a row counter and a column counter.

15. The method of claim 14 further comprising:

switching the pixel data for a respective pixel retrieved from a respective memory device to a video destination based on a value of the row counter.

16. The method of claim 10 further comprising:

switching which memory device to retrieve pixel data from for each pixel with each vertical column of the frame.

17. A method of retrieving pixel data in a checkerboard buffer, comprising:

retrieving pixel data for a first pixel from a first memory address in a first memory device, where the first pixel is the first pixel in a first horizontal row of pixels in a frame;

retrieving pixel data for a second pixel from a second memory address in a second memory device, where the second pixel is the first pixel in a second horizontal row of pixels in the frame;

retrieving pixel data for a third pixel from a third memory address in a third memory device, where the third pixel is the first pixel in a third horizontal row of pixels in the frame;

retrieving pixel data for a fourth pixel from the first memory address in the second memory device, where the fourth pixel is the second pixel in the first horizontal row of pixels in the frame;

retrieving pixel data for a fifth pixel from the second memory address in the third memory device, where the fifth pixel is the second pixel in the second horizontal row of pixels in the frame;

retrieving pixel data for a sixth pixel from the third memory address in the first memory device, where the sixth pixel is the second pixel in the third horizontal row of pixels in the frame;

retrieving pixel data for a seventh pixel from the first memory address in the third memory device, where the seventh pixel is the third pixel in the first horizontal row of pixels in the frame;

retrieving pixel data for an eighth pixel from the second memory address in the first memory device, where the eighth pixel is the third pixel in the second horizontal row of pixels in the frame; and retrieving pixel data for a ninth pixel from the third memory address in the second memory device, where the ninth pixel is the third pixel in the third horizontal row of pixels in the frame;

where the first, second, and third pixels are horizontally adjacent to the fourth fifth, and sixth pixels, respectively, and the fourth, fifth, and sixth pixels are horizontally adjacent to the seventh, eighth, and ninth pixels, respectively.

18. The method of claim 17 wherein each retrieving step occurs during a respective clock cycle.

19. The method of claim 17 wherein:

the retrieving the pixel data for the first, second and third pixels steps occur during a first clock cycle;

the retrieving the pixel data for the fourth, fifth and sixth pixels steps occur during a second clock cycle; and the retrieving the pixel data for the seventh, eighth and ninth pixels steps occur during a third clock cycle.

20. The method of claim 17 wherein:

the retrieving the pixel data for the first, second and third pixels steps occur in parallel;

the retrieving the pixel data for the fourth, fifth and sixth pixels steps occur in parallel; and the retrieving the pixel data for the seventh, eighth and ninth pixels steps occur in parallel.

21. The method of claim 17 further comprising:

generating the first memory address, the second memory address and the third memory address.

22. The method of claim 21 wherein the generating the memory addresses step comprises:

generating the memory addresses using a row counter and a column counter.

23. The method of claim 22 further comprising:

switching the pixel data for a respective pixel retrieved from a respective memory device to a video destination based on a value of the row counter.

24. The method of claim 17 further comprising:

switching which memory device to retrieve pixel data from for each pixel with each vertical column of the frame.

25. A checkerboard buffer for storing pixel data comprising:

means for storing pixel data for a first pixel at a first memory address in a first memory device, where the first pixel is the first pixel in a first horizontal row of pixels in a frame;

means for storing pixel data for a second pixel at the first memory address in a second memory device, where the second pixel is the second pixel in the first horizontal row of pixels in the frame;

means for storing pixel data for a third pixel at the first memory address in a third memory device, where the third pixel is the third pixel in the first horizontal row of pixels in the frame;

means for storing pixel data for a fourth pixel at a second memory address in the second memory device, where the fourth pixel is the first pixel in a second horizontal row of pixels in the frame;

means for storing pixel data for a fifth pixel at the second memory address in the third memory device, where the fifth pixel is the second pixel in the second horizontal row of pixels in the frame;

means for storing pixel data for a sixth pixel at the second memory address in the first memory device, where the sixth pixel is the third pixel in the second horizontal row of pixels in the frame;

means for storing pixel data for a seventh pixel at a third memory address in the third memory device, where the seventh pixel is the first pixel in a third horizontal row of pixels in the frame;

means for storing pixel data for an eighth pixel at the third memory address in the first memory device, where the eighth pixel is the second pixel in the third horizontal row of pixels in the frame; and means for storing pixel data for a ninth pixel at the third memory address in the second memory device, where the ninth pixel is the third pixel in the third horizontal row of pixels in the frame;

where the first, second, and third pixels are vertically adjacent to the fourth fifth, and sixth pixels, respectively, and the fourth, fifth, and sixth pixels are vertically adjacent to the seventh, eighth, and ninth pixels, respectively.

26. A checkerboard buffer for retrieving pixel data comprising:

means for retrieving pixel data for a first pixel from a first memory address in a first memory device, where the first pixel is the first pixel in a first horizontal row of pixels in a frame;

means for retrieving pixel data for a second pixel from a second memory address in a second memory device, where the second pixel is the first pixel in a second horizontal row of pixels in the frame;

means for retrieving pixel data for a third pixel from a third memory address in a third memory device, where the third pixel is the first pixel in a third horizontal row of pixels in the frame;

means for retrieving pixel data for a fourth pixel from the first memory address in the second memory device, where the fourth pixel is the second pixel in the first horizontal row of pixels in the frame;

means for retrieving pixel data for a fifth pixel from the second memory address in the third memory device, where the fifth pixel is the second pixel in the second horizontal row of pixels in the frame;

means for retrieving pixel data for a sixth pixel from the third memory address in the first memory device, where the sixth pixel is the second pixel in the third horizontal row of pixels in the frame;

means for retrieving pixel data for a seventh pixel from the first memory address in the third memory device, where the seventh pixel is the third pixel in the first horizontal row of pixels in the frame;

means for retrieving pixel data for an eighth pixel from the second memory address in the first memory device, where the eighth pixel is the third pixel in the second horizontal row of pixels in the frame; and means for retrieving pixel data for a ninth pixel from the third memory address in the second memory device, where the ninth pixel is the third pixel in the third horizontal row of pixels in the frame;

where the first, second, and third pixels are horizontally adjacent to the fourth fifth, and sixth pixels, respectively, and the fourth, fifth, and sixth pixels are horizontally adjacent to the seventh, eighth, and ninth pixels, respectively.

* * * * *

UNITED STATES PATENT AND TRADEMARK OFFICE

CERTIFICATE OF CORRECTION

PATENT NO. : 6,768,490 B2
DATED : July 27, 2004
INVENTOR(S) : Champion et al.

It is certified that error appears in the above-identified patent and that said Letters Patent is hereby corrected as shown below:

Title page,
Item [60], Related U.S. Application Data, please change "Feb. 24, 2001" to -- Sept. 24, 2001 --.

Column 27,
Line 47, after "fourth" insert -- , -- (comma).

Column 29,
Line 49, after "fourth" insert -- , -- (comma).

Column 30,
Line 60, after "fourth" insert -- , -- (comma).

Column 32,
Line 16, after "fourth" insert -- , -- (comma).

Signed and Sealed this

Twenty-first Day of June, 2005

JON W. DUDAS
*Director of the United States Patent and Trademark Office*